US012813072B2

(12) United States Patent
Jeon

(10) Patent No.: US 12,813,072 B2
(45) Date of Patent: Nov. 24, 2026

(54) DISPLAY PANEL AND METHOD FOR MANUFACTURING THE SAME

(71) Applicant: Samsung Display Co., Ltd., Yongin-si (KR)

(72) Inventor: Woo-Seok Jeon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 504 days.

(21) Appl. No.: 17/869,152

(22) Filed: Jul. 20, 2022

(65) Prior Publication Data

US 2023/0127986 A1 Apr. 27, 2023

(30) Foreign Application Priority Data

Oct. 26, 2021 (KR) ........................ 10-2021-0143395

(51) Int. Cl.
*H01L 27/32* (2006.01)
*H10K 59/121* (2023.01)
*H10K 59/12* (2023.01)

(52) U.S. Cl.
CPC ..... *H10K 59/1213* (2023.02); *H10K 59/1201* (2023.02)

(58) Field of Classification Search
USPC ........................................................... 257/40
See application file for complete search history.

(56) References Cited

U.S. PATENT DOCUMENTS 6,559,014 B1 * 5/2003 Jeon .................. H01L 21/28158 438/758
7,935,964 B2 5/2011 Kim et al.
10,290,657 B2 5/2019 Hanyu et al.
11,024,725 B2 6/2021 Yamazaki et al.
11,152,512 B2 10/2021 Yamazaki et al.
11,195,861 B2 12/2021 Park et al.
2009/0278120 A1 * 11/2009 Lee .................... H10D 30/6739 257/E29.296
2010/0308383 A1 12/2010 Shin
(Continued)

FOREIGN PATENT DOCUMENTS

JP 2017028288 A 2/2017
JP 2018125340 A 8/2018
(Continued)

OTHER PUBLICATIONS

Vincenc Nemanič et al., Hydrogen permeation barriers: Basic requirements, materials selection, deposition methods, and quality evaluation, Nuclear Materials and Energy, pp. 451-457, May 1, 2019.

*Primary Examiner* — Dzung Tran
(74) *Attorney, Agent, or Firm* — CANTOR COLBURN LLP

(57) ABSTRACT

A display panel includes a light-emitting element, and a pixel circuit electrically connected to the light-emitting element, where the pixel circuit includes a transistor. The transistor includes: a gate; a first insulating pattern overlapping the gate, and disposed under the gate; a second insulating pattern including a part disposed outside the first insulating pattern in a plan view; and a semiconductor pattern disposed under the first insulating pattern and the second insulating pattern, and overlapping the first insulating pattern and the second insulating pattern in the plan view.

12 Claims, 19 Drawing Sheets

(56) References Cited

U.S. PATENT DOCUMENTS

| | | | | |
|---|---|---|---|---|
| 2013/0256673 | A1* | 10/2013 | Nishiyama | H10D 64/254<br>257/59 |
| 2015/0084035 | A1 | 3/2015 | Kim et al. | |
| 2015/0255612 | A1* | 9/2015 | Yamazaki | H10D 30/6713<br>257/43 |
| 2016/0284856 | A1* | 9/2016 | Shimomura | H10D 30/6758 |
| 2017/0012139 | A1* | 1/2017 | Sasagawa | H10D 87/00 |
| 2017/0162606 | A1* | 6/2017 | Yan | H10D 30/6757 |
| 2018/0366526 | A1 | 12/2018 | Lee et al. | |
| 2019/0165184 | A1* | 5/2019 | Ji | H10D 30/6723 |
| 2021/0066421 | A1* | 3/2021 | Son | H10K 59/124 |

FOREIGN PATENT DOCUMENTS

| | | | |
|---|---|---|---|
| JP | 2019075532 | A | 5/2019 |
| KR | 101142334 | B1 | 5/2012 |
| KR | 1020150033155 | A | 4/2015 |
| KR | 101519480 | B1 | 5/2015 |
| KR | 1020180137642 | A | 12/2018 |
| KR | 1020190060260 | A | 6/2019 |
| KR | 1020190062695 | A | 6/2019 |
| KR | 1020200125843 | A | 11/2020 |

* cited by examiner

DISPLAY PANEL AND METHOD FOR MANUFACTURING THE SAME

This application claims priority to Korean Patent Application No. 10-2021-0143395, filed on Oct. 26, 2021, and all the benefits accruing therefrom under 35 U.S.C. § 119, the content of which in its entirety is herein incorporated by reference.

BACKGROUND

The present disclosure herein relates to a display panel and a method for manufacturing the same, and more particularly, to a display panel including an oxide transistor, and a method for manufacturing the display panel including the oxide transistor.

A display device includes a display panel, and the display panel includes a light-emitting element, and a pixel circuit for controlling an electrical signal applied to the light-emitting element. The pixel circuit may include at least two transistors. With the development of a high-resolution display panel, designing of transistors is being limited.

SUMMARY

The present disclosure provides a high-resolution display panel.

The present disclosure also provides a method for manufacturing a high-resolution display panel.

An embodiment of the present invention provides a display panel including a light-emitting element, and a pixel circuit electrically connected to the light-emitting element. The pixel circuit includes a first transistor. The first transistor includes: a gate; a first insulating pattern overlapping the gate, and disposed under the gate; a second insulating pattern including a certain part, where the certain part is disposed outside the first insulating pattern in a plan view; and a first semiconductor pattern disposed under the first insulating pattern and the second insulating pattern, and overlapping the first insulating pattern and the second insulating pattern in the plan view.

In an embodiment, the first semiconductor pattern may include a first region having a first doping concentration, a second region having a second doping concentration higher than the first doping concentration, and a third region having a third doping concentration higher than the second doping concentration. The first region may overlap the first insulating pattern, the second region may overlap the certain part of the second insulating pattern, and the third region may be disposed outside the second insulating pattern in the plan view.

In an embodiment, the first semiconductor pattern may include an oxide semiconductor. The first semiconductor pattern may include a first region having a first hydrogen concentration, a second region having a second hydrogen concentration higher than the first hydrogen concentration, and a third region having a third hydrogen concentration higher than the second hydrogen concentration. The first region may overlap the first insulating pattern, the second region may overlap the certain part of the second insulating pattern, and the third region may be disposed outside the second insulating pattern in the plan view.

In an embodiment, the first region may be defined as a channel region, and the channel region has a length of about 3 micrometers (μm) or less.

In an embodiment, a source region and a drain region which are disposed with the first region therebetween may include the second region.

In an embodiment, the certain part of the second insulating pattern may surround, in the plan view, a conductive pattern which defines the gate.

In an embodiment, the pixel circuit may further include a second transistor. The second transistor may include a second semiconductor pattern disposed on a different layer from the first semiconductor pattern. The second semiconductor pattern may include polysilicon.

In an embodiment, the second insulating pattern may be disposed between the first insulating pattern and the first semiconductor pattern.

In an embodiment, the second insulating pattern may be in contact with a side surface of the first insulating pattern.

In an embodiment, the second insulating pattern may include silicon oxide, aluminum oxide, or chromium oxide.

In an embodiment, the first insulating pattern may include silicon oxide, and the second insulating pattern may include silicon oxide which has a hydrogen concentration lower than a hydrogen concentration of the first insulating pattern.

In an embodiment, the display panel may further include a conductive pattern overlapping the first semiconductor pattern, and disposed on the lower side of the first semiconductor pattern, and a plurality of inorganic layers disposed between the conductive pattern and the first semiconductor pattern. The plurality of inorganic layers may include a first silicon oxide layer in contact with the first semiconductor pattern, a second silicon oxide layer disposed under the first silicon oxide layer, and a silicon nitride layer disposed under the first silicon oxide layer. A hydrogen concentration of the first silicon oxide layer may be equal to or less than about 1/10 of a hydrogen concentration of the second silicon oxide layer.

In an embodiment, the conductive pattern may be electrically connected to the gate.

In an embodiment, the display panel may further include a conductive pattern overlapping the first semiconductor pattern, and disposed under the first semiconductor pattern, a hydrogen diffusion barrier layer disposed between the conductive pattern and the first semiconductor pattern, and contacting the conductive pattern, and a silicon oxide layer, a silicon nitride layer, or a silicon oxynitride layer disposed between the conductive pattern and the hydrogen diffusion barrier layer. The hydrogen diffusion barrier layer comprises an aluminum oxide layer, a chromium oxide layer, or a silicon oxide layer having a hydrogen concentration of about $2\times10^{18}$ atoms per cubic centimeters (at/$cm^3$) or less.

In an embodiment of the present invention, a method for manufacturing a display panel includes: forming a first inorganic layer; forming a semiconductor pattern on the first inorganic layer; forming a hydrogen diffusion barrier layer which covers the semiconductor pattern; forming a second inorganic layer on the hydrogen diffusion barrier layer; forming, on the second inorganic layer, a gate which overlaps the semiconductor pattern; etching the hydrogen diffusion barrier layer and the second inorganic layer using the gate as a mask; and forming a third inorganic layer on the etched hydrogen diffusion barrier layer and the etched second inorganic layer. In the etching of the hydrogen diffusion barrier layer and the second inorganic layer, a hydrogen diffusion barrier pattern overlapping the gate is formed from the hydrogen diffusion barrier layer, and a gate insulating pattern overlapping the gate is formed from the second inorganic layer. The etched hydrogen diffusion barrier layer corresponds to the hydrogen diffusion barrier pattern, the etched second inorganic layer corresponds to the gate insulating pattern, and a part of the hydrogen diffusion barrier pattern is disposed outside the gate insulating pattern in a plan view.

In an embodiment, the first inorganic layer or the third inorganic layer may include silicon oxide, silicon nitride, or silicon oxynitride. The hydrogen diffusion barrier layer may include aluminum oxide, chromium oxide, or silicon oxide having a hydrogen concentration of $2\times10^{18}$ at/cm$^3$ or less.

In an embodiment, the second inorganic layer may include silicon oxide.

In an embodiment, the method may further include, before the forming of the semiconductor pattern, forming a lower hydrogen diffusion barrier layer on the first inorganic layer. The lower hydrogen diffusion barrier layer may include aluminum oxide, chromium oxide, or silicon oxide having a hydrogen concentration of $2\times10^{18}$ at/cm$^3$ or less.

In an embodiment of the present invention, a method for manufacturing a display panel may include forming a first inorganic layer, forming a semiconductor pattern on the first inorganic layer, forming a second inorganic layer which covers the semiconductor pattern, forming, on the second inorganic layer, a gate which overlaps the semiconductor pattern, etching the second inorganic layer using the gate as a mask so that a gate insulating pattern overlapping the gate is formed from the second inorganic layer, forming a hydrogen diffusion barrier layer which covers the gate and the gate insulating pattern, etching the hydrogen diffusion barrier layer so that a hydrogen diffusion barrier pattern overlapping a side surface of the gate insulating pattern is formed from the hydrogen diffusion barrier layer, and forming a third inorganic layer which covers the gate, the gate insulating pattern, and the hydrogen diffusion barrier pattern.

In an embodiment, the first inorganic layer or the third inorganic layer may include silicon oxide, silicon nitride, or silicon oxynitride. The hydrogen diffusion barrier layer may include aluminum oxide, chromium oxide, or silicon oxide having a hydrogen concentration of about $2\times10^{18}$ at/cm$^3$ or less.

In an embodiment, the second inorganic layer may include silicon oxide.

In an embodiment, the method may further include, before the forming of the semiconductor pattern, forming a lower hydrogen diffusion barrier layer on the first inorganic layer. The lower hydrogen diffusion barrier layer may include aluminum oxide, chromium oxide, or silicon oxide having a hydrogen concentration of $2\times10^{18}$ at/cm$^3$ or less.

BRIEF DESCRIPTION OF THE FIGURES

The accompanying drawings are included to provide a further understanding of the present invention, and are incorporated in and constitute a part of this specification. The drawings illustrate embodiments of the present invention and, together with the description, serve to explain principles of the present invention. In the drawings.

DETAILED DESCRIPTION

Figure 1:
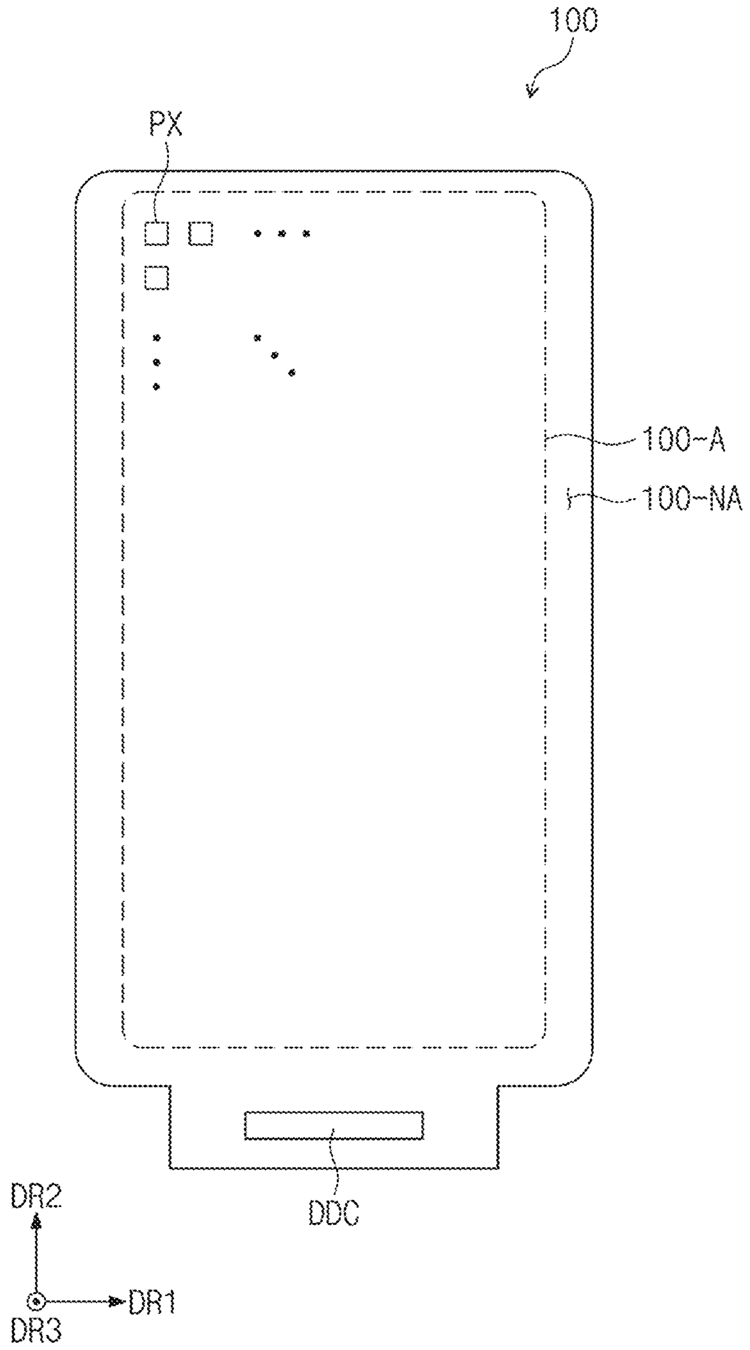
FIG. 1 is a plan view of a display panel according to an embodiment.

In this specification, when a component (or region, layer, portion, etc.) is referred to as "on", "connected", or "coupled" to another component, it means that it is placed/connected/coupled directly on the other component or a third component can be disposed between them.

The same reference numerals or symbols refer to the same elements. In addition, in the drawings, thicknesses, ratios, and dimensions of components are exaggerated for effective description of technical content. "And/or" includes all combinations of one or more that the associated elements may define.

Terms such as "first" and "second" may be used to describe various components, but the components should not be limited by the terms. These terms are only used for the purpose of distinguishing one component from other components. For example, without departing from the scope of the present invention, a first component may be referred to as a second component, and similarly, a second component may be referred to as a first component. Singular expressions include plural expressions unless the context clearly indicates otherwise.

In addition, terms such as "below", "lower", "above", and "upper" are used to describe the relationship between components shown in the drawings. The terms are relative concepts and are described based on the directions indicated in the drawings.

Terms such as "include" or "have" are intended to designate the presence of a feature, number, step, action, component, part, or combination thereof described in the specification, and it should be understood that it does not preclude the possibility of presence or addition of one or more other features, numbers, steps, operations, components, parts, or combinations thereof.

Unless otherwise defined, all terms (including technical and scientific terms) used in this specification have the same meaning as commonly understood by one of ordinary skill in the art to which this invention belongs. In addition, terms such as terms defined in commonly used dictionaries should be interpreted as having a meaning consistent with the meaning having in the context of the related technology, and should not be interpreted as too ideal or too formal unless explicitly defined here.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, a display panel according to an embodiment will be described with reference to the accompanying drawings.

Figure 2:
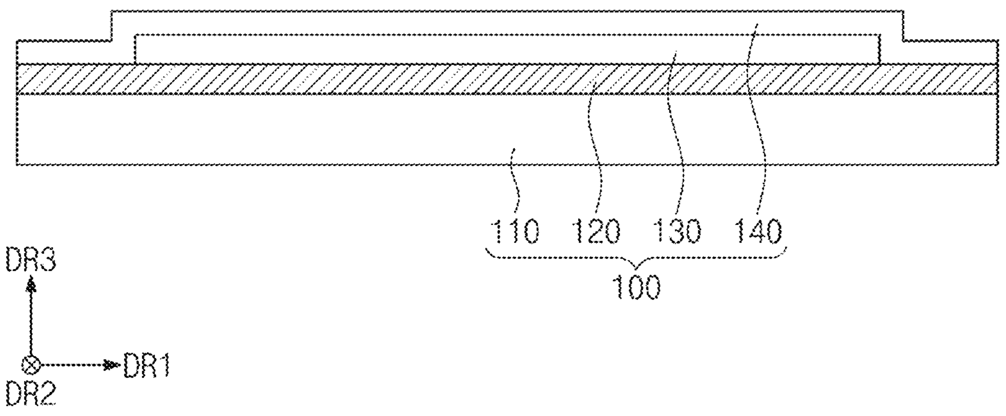
FIG. 2 is a cross-sectional view of a display panel according to an embodiment.

FIG. 1 is a plan view of a display panel 100 according to an embodiment. FIG. 2 is a cross-sectional view of the display panel 100 according to an embodiment. As used herein, "plan view" is a view from a thickness direction DR3 of the substrate 110.

Referring to FIG. 1, the display panel 100 may include a display region 100-A and a non-display region 100-NA. The non-display region 100-NA may be adjacent to the display region 100-A, and surround at least a part of the display region 100-A. A pixel PX may be disposed in the display region 100-A, and may not be disposed in the non-display region 100-NA. A data driving circuit DDC may be disposed on one side of the non-display region 100-NA.

The display region 100-A may include a plane defined by a first direction DR1 and a second direction DR2. The thickness direction of the display panel 100 may be parallel to a third direction DR3 which is the normal direction of the display region 100-A. The front surface (or upper surface) and the rear surface (or lower surface) of each member constituting the display panel 100 may be defined based on the third direction DR3.

The display panel 100 may be a light-emitting display panel. For example, the display panel 100 may be an organic light-emitting display panel, an inorganic light-emitting display panel, a micro-LED display panel, or a nano-LED display panel. The display panel 100 may be flexible. Although not illustrated, the display panel 100 may be foldable with respect to at least one folding axis. A folding region may cross the display region 100-A.

Referring to FIG. 2, the display panel 100 may include a base layer 110, a circuit layer 120, a light-emitting element layer 130, and an encapsulation layer 140. Unlike what is illustrated, another functional layer may be further disposed between two adjacent layers among the base layer 110, the circuit layer 120, the light-emitting element layer 130, and the encapsulation layer 140.

The base layer 110 may provide a base surface on which the circuit layer 120 is disposed. The base layer 110 may be a flexible substrate which is bendable, foldable, and rollable. The base layer 110 may be a glass substrate, a metal substrate, a polymer substrate, or the like, but an embodiment of the present invention is not limited thereto. The base layer 110 may include an inorganic layer, an organic layer, or a composite material layer in another embodiment.

The base layer 110 may include multiple layers. For example, the base layer 110 may include a first synthetic resin layer, a single- or multi-layered inorganic layer, and a second synthetic resin layer disposed on the single- or multi-layered inorganic layer. The first synthetic resin layer and the second synthetic resin layer may each include a polyimide-based resin, and an embodiment of the present invention is not limited thereto.

The circuit layer 120 may be disposed on the base layer 110. The circuit layer 120 may include an insulating layer, a semiconductor pattern, a conductive pattern, a signal line, etc.

The light-emitting element layer 130 may be disposed on the circuit layer 120. The light-emitting element layer 130 may include a light-emitting element. For example, the light-emitting element may include an organic light-emitting material, an inorganic light-emitting material, an organic-inorganic light-emitting material, a quantum dot, a quantum rod, a micro-LED, or a nano-LED.

The encapsulation layer 140 may be disposed on the light-emitting element layer 130. The encapsulation layer 140 may protect the light-emitting element layer from foreign matters such as moisture, oxygen, and dust particles. The encapsulation layer 140 may include at least one inorganic layer. The encapsulation layer 140 may include a structure in which an inorganic layer, an organic layer, and an inorganic layer are sequentially stacked.

Figure 3A:
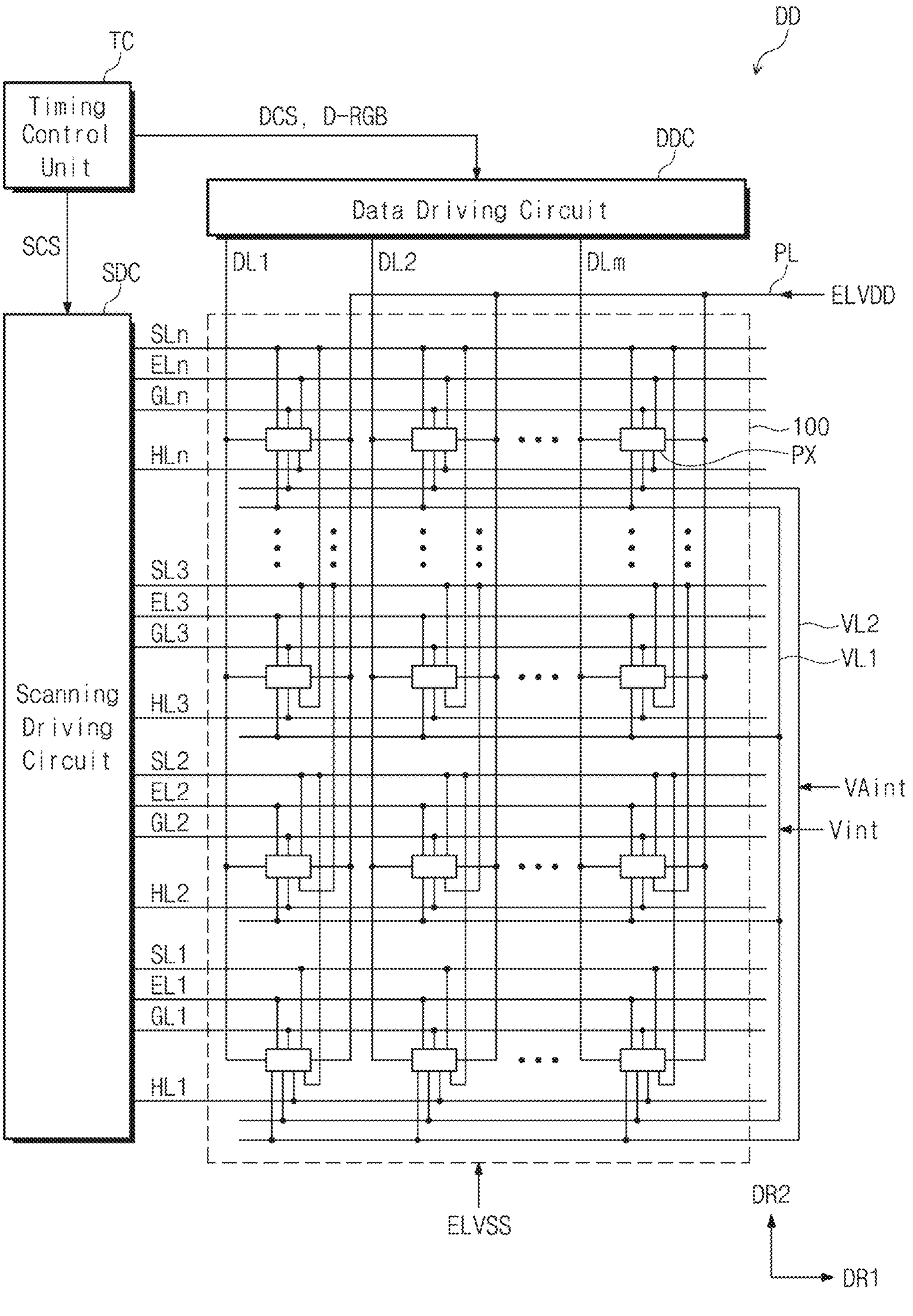
FIG. 3A is a block diagram of a display device according to an embodiment.
Figure 3B:
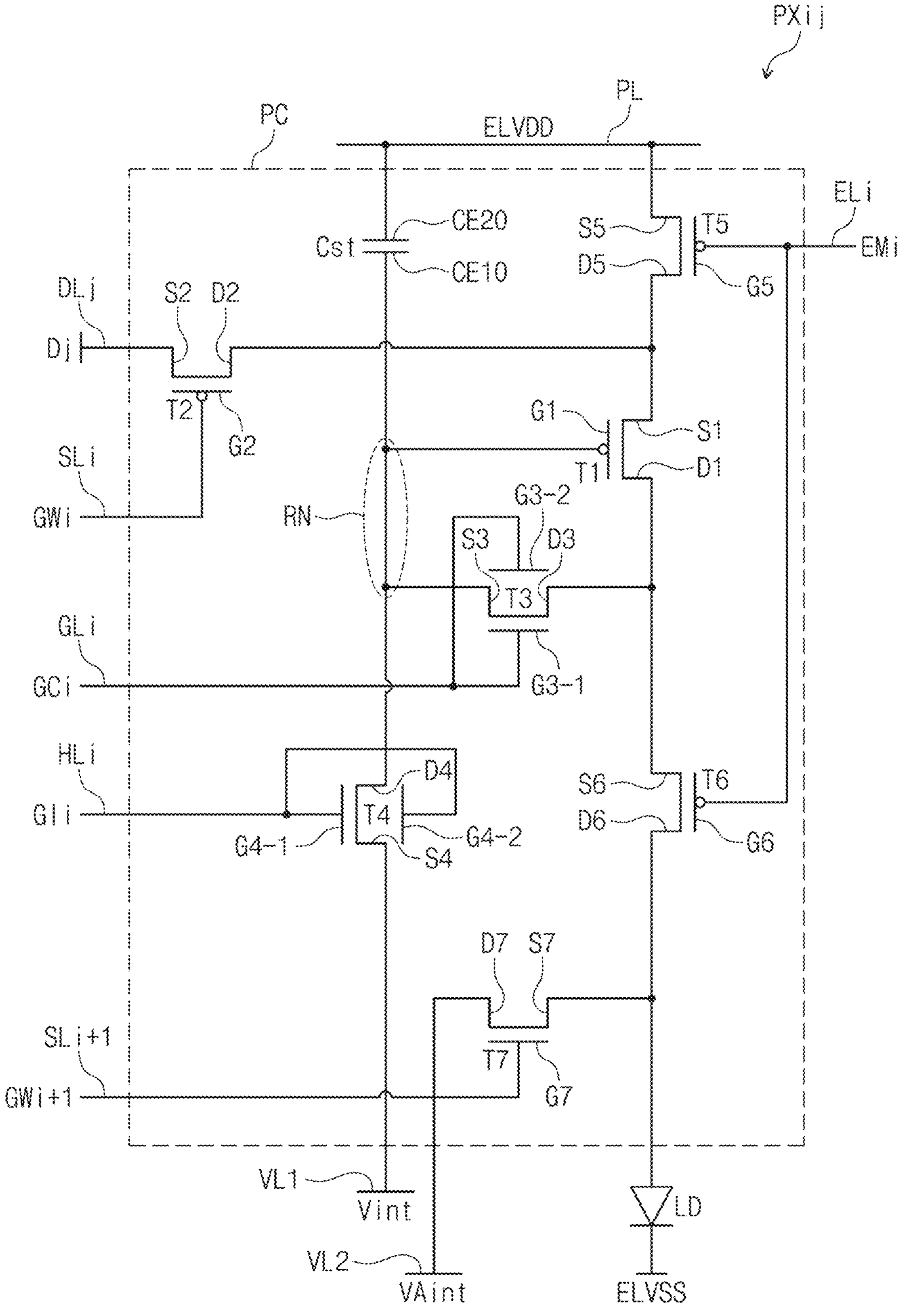
FIG. 3B is an equivalent circuit diagram of a pixel according to an embodiment.
Figure 3C:
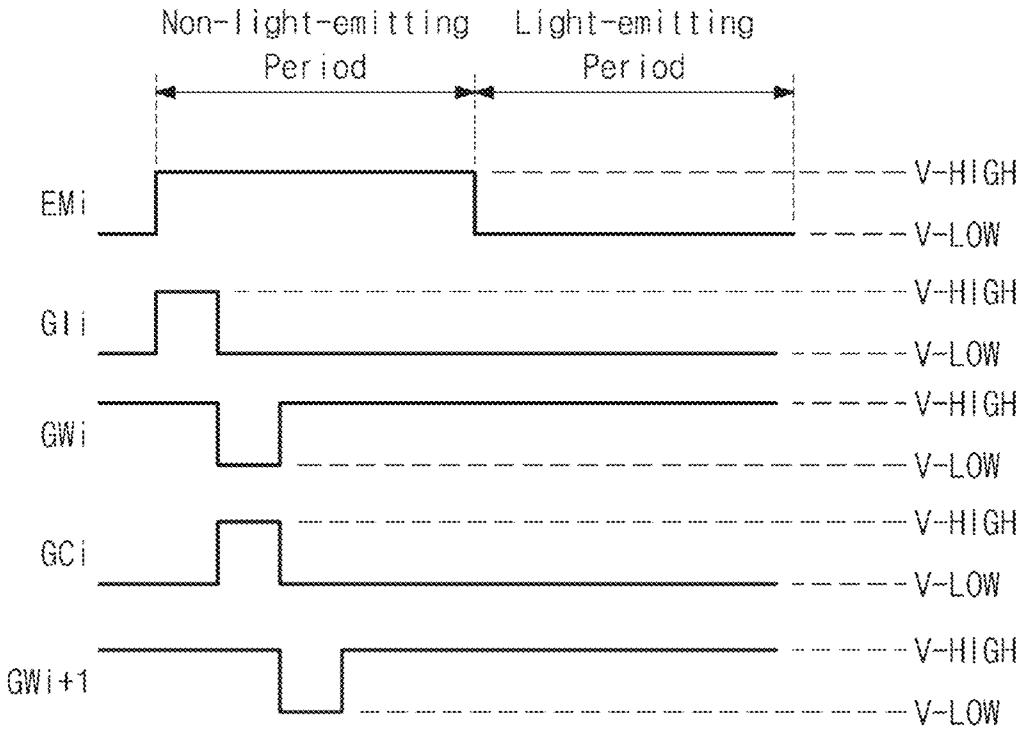
FIG. 3C is a waveform diagram of driving signals for driving a pixel according to an embodiment.

FIG. 3A is a block diagram of a display device DD according to an embodiment. FIG. 3B is an equivalent circuit diagram of a pixel PX according to an embodiment. FIG. 3C is a waveform diagram of driving signals for driving the pixel PX according to an embodiment.

The display device DD may include a timing control unit TC, a scanning driving circuit SDC, a data driving circuit DDC, and a display panel 100. At least one among the timing control unit TC, the scanning driving circuit SDC, and the data driving circuit DDC may be provided as a driving chip form, or may be directly disposed on the display panel 100.

The timing control unit TC may receive input image signals, and may generate image data D-RGB by converting the data format of the input image signals to meet the interface specification with the scanning driving circuit SDC. The timing control unit TC outputs the image data D-RGB and various types of control signals DCS and SCS.

The scanning driving circuit SDC may receive a scanning control signal SCS from the timing control unit TC. The scanning control signal SCS may include a vertical initiation signal for initiating an operation of the scanning driving circuit SDC, a clock signal for determining output timings of signals, etc. The scanning driving circuit SDC may generate a plurality of scan signals, and may sequentially output scan signals to signal lines SL1 to SLn, GL1 to GLn, and HL1 to HLn corresponding thereto. In addition, the scanning driving circuit SDC may generate a plurality of light-emitting control signals in response to the scanning control signal SCS, and may output light-emitting control signals to light-emitting lines EL1 to ELn corresponding thereto.

FIG. 3A illustrates that a plurality of scan signals and a plurality of light-emitting control signals are output from one scanning driving circuit SDC, but an embodiment of the present invention is not limited thereto. For example, the scanning driving circuit SDC may be provided in plurality in another embodiment. A plurality of scanning driving circuits SDC may separately generate and output scan signals, and may separately generate and output a plurality of light-emitting control signals. In addition, a driving circuit, which generates and outputs a plurality of scan signals, and a driving circuit, which generates and outputs a plurality of light-emitting control signals, may be separated.

The data driving circuit DDC may receive a data control signal DCS and the image data D-RGB from the timing control unit TC. The data driving circuit DDC may convert the image data D-RGB to data signals, and may output the data signals to a plurality of data lines DL1 to DLm to be described later. The data signals may be analog voltages corresponding to the gradation value of the image data D-RGB.

A plurality of groups of signal lines may include a first group of scanning lines SL1 to SLn, a second group of scanning lines GL1 to GLn, a third group of scanning lines HL1 to HLn, light-emitting lines EL1 to ELn, data lines DL1 to DLm, a first voltage line PL, a second voltage line VL1, and a third voltage line VL2. The first group of scanning lines SL1 to SLn, the second group of scanning lines GL1 to GLn, the third group of scanning lines HL1 to HLn, and the light-emitting lines EL1 to ELn may extend in the first direction DR1, and may be arranged in the second direction DR2 crossing the first direction DR1. The plurality of data lines DL1 to DLm may cross, in an insulating manner, the first group of scanning lines SL1 to SLn, the second group of scanning lines GL1 to GLn, the third group of scanning lines HL1 to HLn, and the light-emitting lines EL1 to ELn.

The first voltage line PL, the second voltage line VL1, and the third voltage line VL2 may each include at least one of a component extending in the first direction DR1, or a component extending in the second direction DR2. The first voltage line PL, the second voltage line VL1, and the third voltage line VL2 may each include the component extending in the first direction DR1, and the component extending in the second direction DR2. The structures and shapes of the first voltage line PL, the second voltage line VL1, and the third voltage line VL2 may be designed independently of each other.

A plurality of pixels PX may be electrically connected to corresponding signal lines among the aforementioned signal lines, respectively. The connection relationship between pixels PX and signal lines may be changed according to the configuration of a driving circuit of the pixels PX.

The first voltage line PL may receive a first power supply voltage ELVDD. A second power supply voltage ELVSS may be applied to the display panel 100. The second power supply voltage ELVSS may have a lower level than the first power supply voltage ELVDD.

The second voltage line VL1 may receive a first initialization voltage Vint. The first initialization voltage Vint may have a lower level than the first power supply voltage ELVDD. The third voltage line VL2 may receive a second initialization voltage VAint. The second initialization voltage VAint may have a lower level than the first power supply voltage ELVDD. The first initialization voltage Vint and the second initialization voltage VAint may be each a bias voltage having a constant level. The first initialization voltage Vint and the second initialization voltage VAint may have different levels. The second initialization voltage VAint may have a lower level than the first initialization voltage Vint.

The plurality of pixels PX may include a plurality of groups generating light having colors different from each other. For example, the plurality of pixels PX may include red pixels generating red light, green pixels generating green light, and blue pixels generating blue light. A light-emitting element having a red pixel, a light-emitting element having a green pixel, and a light-emitting element having a blue pixel may include light-emitting layers formed of different materials.

FIG. 3B exemplarily illustrates a pixel PXij which is connected to an i-th scanning line SLi in the first group among the first group of scanning lines SL1 to SLn, and connected to a j-th data line DLj among the plurality of data lines DL1 to DLm. The pixel PXij may include a pixel-driving circuit PC (hereinafter, pixel circuit) and a light-emitting element LD.

In an embodiment, the pixel circuit PC may include first to seventh transistors T1 to T7, and a capacitor Cst. A first transistor T1, a second transistor T2, and a fifth transistor T5 to a seventh transistor T7 may be P-type transistors, and a third transistor T3 and a fourth transistor T4 may be N-type transistors. However, an embodiment of the present invention is not limited thereto, and the first to seventh transistors T1 to T7 may be each configured as either of a P-type transistor or an N-type transistor in another embodiment.

Hereinafter, an input region (or input electrode) of an N-type transistor is described as a drain (or drain region), an input region of a P-type transistor is described as a source (or source region), an output region (or output electrode) of an N-type transistor is described as a source (or source region), and an output region of a P-type transistor is described as a drain (or drain region). At least one among the first to seventh transistors T1 to T7 may be omitted.

In the present embodiment, the first transistor T1, the second transistor T2, and the fifth transistor T5 to the seventh transistor T7 may be silicon transistors, and the third transistor T3 and the fourth transistor T4 may be oxide transistors. However, an embodiment of the present invention is not limited thereto, and the first to seventh transistors T1 to T7 may be each configured as either of a silicon transistor or an oxide transistor in another embodiment.

The first transistor T1 may be a driving transistor, and the second transistor T2 may be a switching transistor. The capacitor Cst may be electrically connected between the first voltage line PL receiving the first power supply voltage ELVDD and a reference node RN. The capacitor Cst may include a first electrode CE10 electrically connected to the reference node RN, and a second electrode CE20 electrically connected to the first voltage line PL.

The first transistor T1 may be electrically connected between the first voltage line PL and an electrode (for example, anode) of the light-emitting element LD. A source S1 of the first transistor T1 may be electrically connected to the first voltage line PL. In the present disclosure, "being electrically connected between a transistor and a signal line, or between a transistor and a transistor" means "a source, a drain, and a gate of a transistor have an integrated shape with a signal line, or are connected through a connection electrode". Another transistor may be disposed between the source S1 of the first transistor T1 and the first voltage line PL, or may be omitted.

A drain D1 of the first transistor T1 may be electrically connected to the anode of the light-emitting element LD. Another transistor may be disposed between the drain D1 of the first transistor T1 and the anode of the light-emitting element LD, or may be omitted. A gate G1 of the first transistor T1 may be electrically connected to the reference node RN.

The second transistor T2 may be electrically connected between the j-th data line DLj and the source S1 of the first transistor T1. A source S2 of the second transistor T2 is electrically connected to the j-th data line DLj, and a drain D2 of the second transistor T2 is electrically connected to the source S1 of the first transistor T1. A gate G2 of the second transistor T2 may be electrically connected to the i-th scanning line SLi in the first group.

The third transistor T3 may be electrically connected between the reference node RN and the drain D1 of the first transistor T1. A drain D3 of the third transistor T3 may be electrically connected to the drain D1 of the first transistor T1, and a source S3 of the third transistor T3 may be electrically connected to the reference node RN. Gates G3-1 and G3-2 of the third transistor T3 may be electrically connected to an i-th scanning line GLi in the second group. Although it is illustrated that the third transistor T3 includes a plurality of gates, an embodiment of the present invention is not limited thereto, and the third transistor T3 may include only one gate in another embodiment.

The fourth transistor T4 may be electrically connected between the reference node RN and the second voltage line VL1. A drain D4 of the fourth transistor T4 may be electrically connected to the reference node RN, and a source S4 of the fourth transistor T4 may be electrically connected to the second voltage line VL1. Gates G4-1 and G4-2 of the fourth transistor T4 may be electrically connected to an i-th scanning lines HLi in the third group. Although it is illustrated that the fourth transistor T4 includes a plurality of gates, an embodiment of the present invention is not limited thereto, and the fourth transistor T4 may include only one gate in another embodiment.

The fifth transistor T5 may be electrically connected between the first voltage line PL and the source S1 of the first transistor T1. A source S5 of the fifth transistor T5 may be electrically connected to the first voltage line PL, and a drain D5 of the fifth transistor T5 may be electrically connected to the source S1 of the first transistor T1. A gate G5 of the fifth transistor T5 may be electrically connected to an i-th light-emitting line ELi.

The sixth transistor T6 may be electrically connected between the drain D1 of the first transistor T1 and the light-emitting element LD. A source S6 of the sixth transistor T6 may be electrically connected to the drain D1 of the first transistor T1, and a drain D6 of the sixth transistor T6 may be electrically connected to the anode of the light-emitting element LD. A gate G6 of the sixth transistor T6 may be electrically connected to the i-th light-emitting line ELi. Unlike this, the gate G6 of the sixth transistor T6 may be connected to the gate G5 of the fifth transistor T5, and another signal line.

The seventh transistor T7 may be electrically connected between the drain D6 of the sixth transistor T6 and the third voltage line VL2. A source S7 of the seventh transistor T7 is electrically connected to the drain D6 of the sixth transistor T6, and a drain D7 of the seventh transistor T7 is electrically connected to the third voltage line VL2. A gate G7 of the seventh transistor T7 may be electrically connected to an (i+1)st scanning line SLi+1 in the first group.

Referring to FIGS. 3B and 3C, an operation of a pixel PXij will be described in more detail. A display device DD may display an image for every frame interval. For each frame interval, signal lines of each of a first group of scanning lines SL1 to SLn, a second group of scanning lines GL1 to GLn, a third group of scanning lines HL1 to HLn, and light-emitting lines EL1 to ELn may be sequentially scanned. FIG. 3C illustrates a part of one frame interval.

Referring to FIG. 3C, signals EMi, Gli, GWi, GCi, and GWi+1 may each have a high level V-HIGH for one interval, and a low level V-LOW for another interval. N-type transistors may be turned on, when a corresponding signal has a high level V-HIGH, and P-type transistors may be turned on, when a corresponding signal has a low level V-LOW.

When a light-emitting control signal EMi has a high level V-HIGH, the fifth transistor T5 and the transistor T6 may be turned off. When the fifth transistor T5 and the transistor T6 are turned off, a current path between the first voltage line PL and the light-emitting element LD may not be formed. Accordingly, this interval may be defined as a non-light-emitting interval.

When a scanning signal Gli applied to the i-th scanning line HLi in the third group has a high level V-HIGH, the fourth transistor T4 may be turned on. When the fourth transistor T4 is turned on, the reference node RN may be initialized by a first initialization voltage Vint. When a scan signal GWi applied to the i-th scanning line SLi in the first group has a low level V-LOW, and a scan signal GCi applied to the i-th scanning line GLi in the second group has a high level V-HIGH, the second transistor T2 and the third transistor T3 may be turned on.

Since the reference node RN is initialized with the first initialization voltage Vint, the first transistor T1 may be turned on. When the first transistor T1 is turned on, a voltage corresponding to a data signal Dj (see FIG. 2) is supplied to the reference node RN. At this time, the capacitor Cst may store a voltage corresponding to the data signal Dj. The voltage corresponding to the data signal Dj may be a voltage obtained by reducing a threshold voltage Vth of the first transistor T1 from the data signal Dj.

When a scan signal GWi+1 applied to an (i+1)st scanning line SLi+1 in the first group has a low level V-LOW, the seventh transistor T7 may be turned on. Since the seventh transistor T7 is turned on, the anode of the light-emitting element LD is initialized with a second initialization voltage VAint. A parasitic capacitor of the light-emitting element LD may be discharged.

When a light-emitting control signal EMi has a low level V-LOW, the fifth transistor T5 and the transistor T6 may be turned on. When the fifth transistor T5 is turned on, the first power supply voltage ELVDD may be supplied to the first transistor T1. When the transistor T6 is turned on, the first transistor T1 and the light-emitting element LD may be electrically connected. The light-emitting element LD may generate light having luminescence corresponding to the amount of current supplied.

Figure 4A:
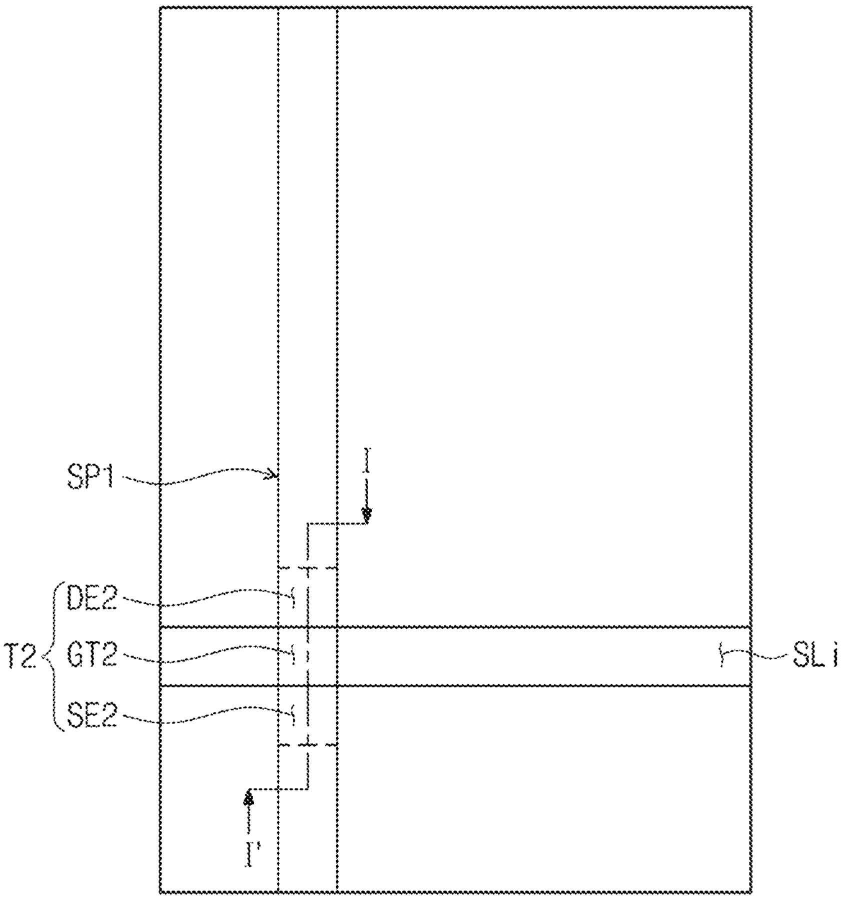
FIG. 4A is an enlarged plan view of a silicon transistor according to an embodiment.
Figure 4B:
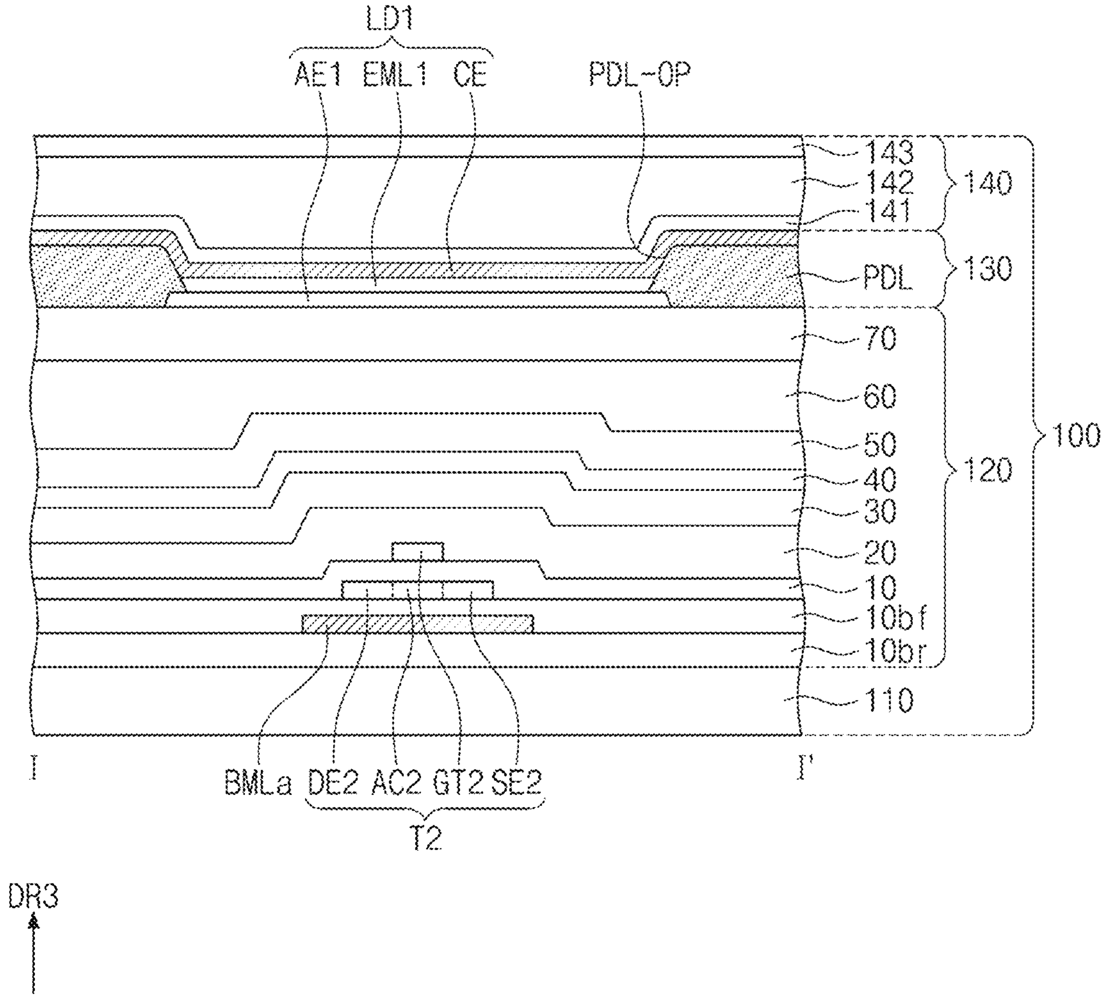
FIG. 4B is a cross-sectional view taken along I-I' of FIG. 4A.
Figure 5A:
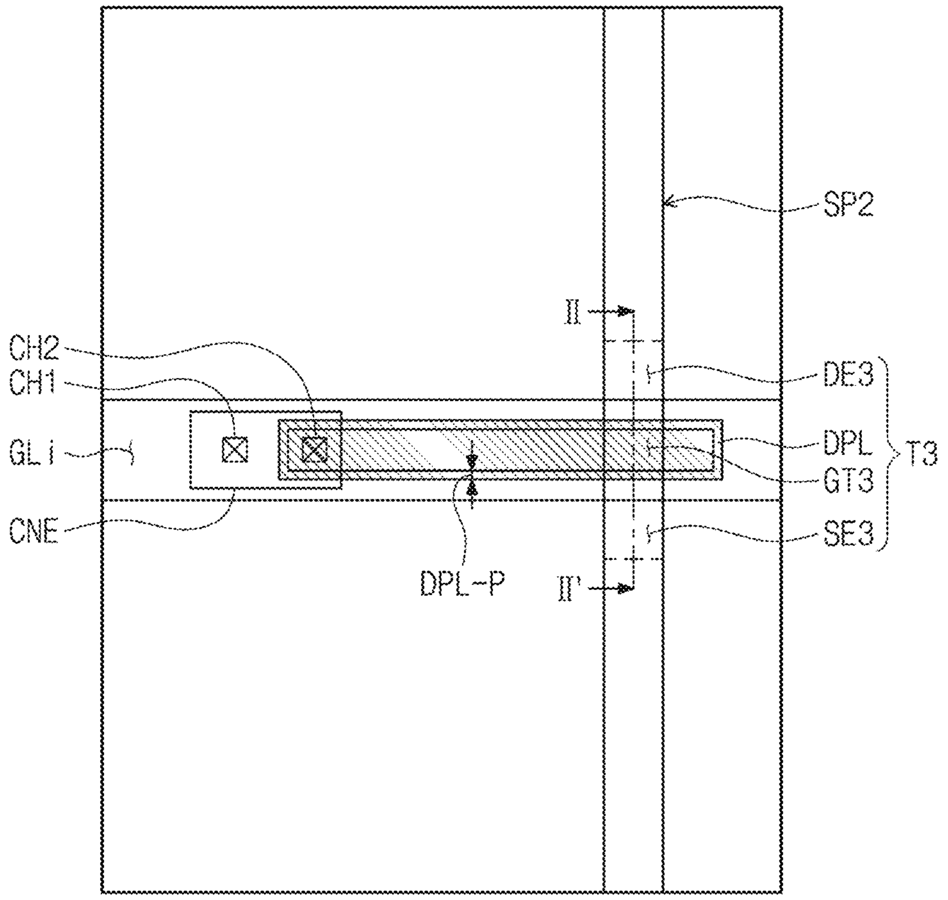
FIG. 5A is an enlarged plan view of an oxide transistor according to an embodiment.
Figure 5B:
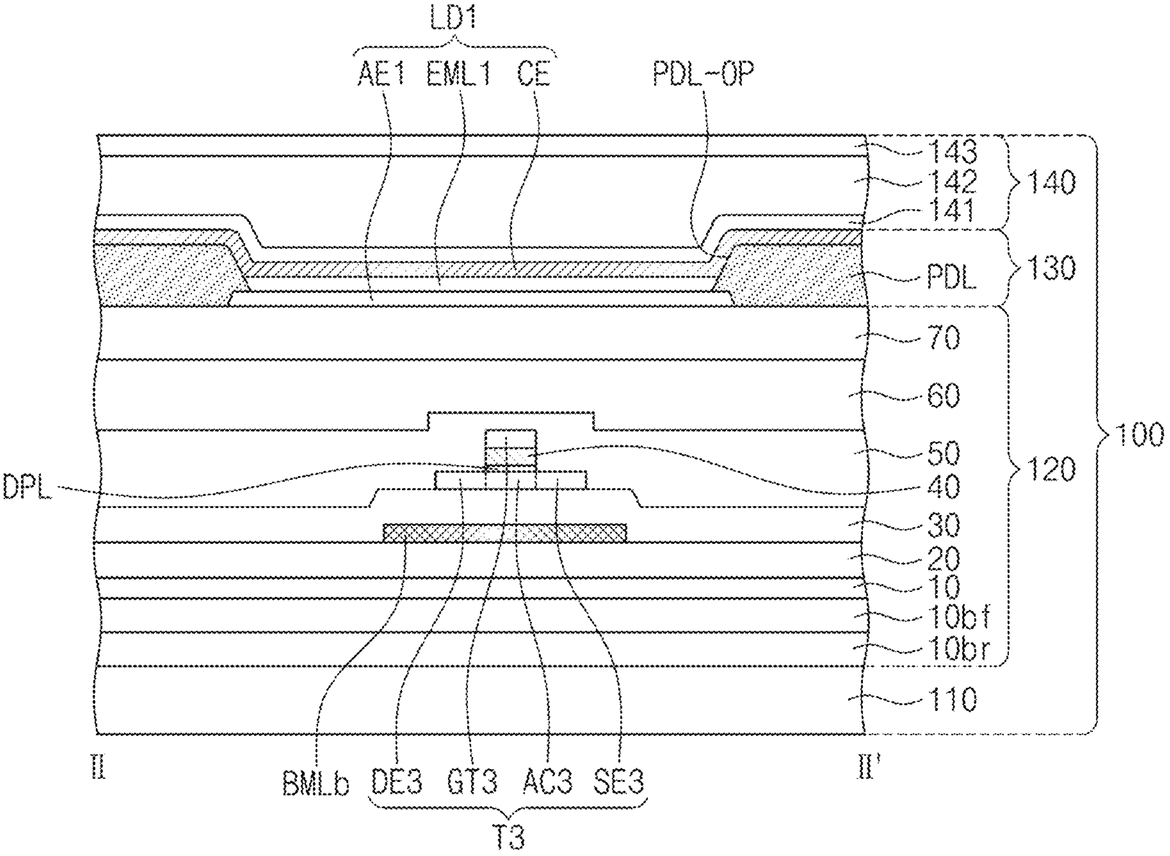
FIG. 5B is a cross-sectional view taken along II-II' of FIG. 5A.
Figure 5C:
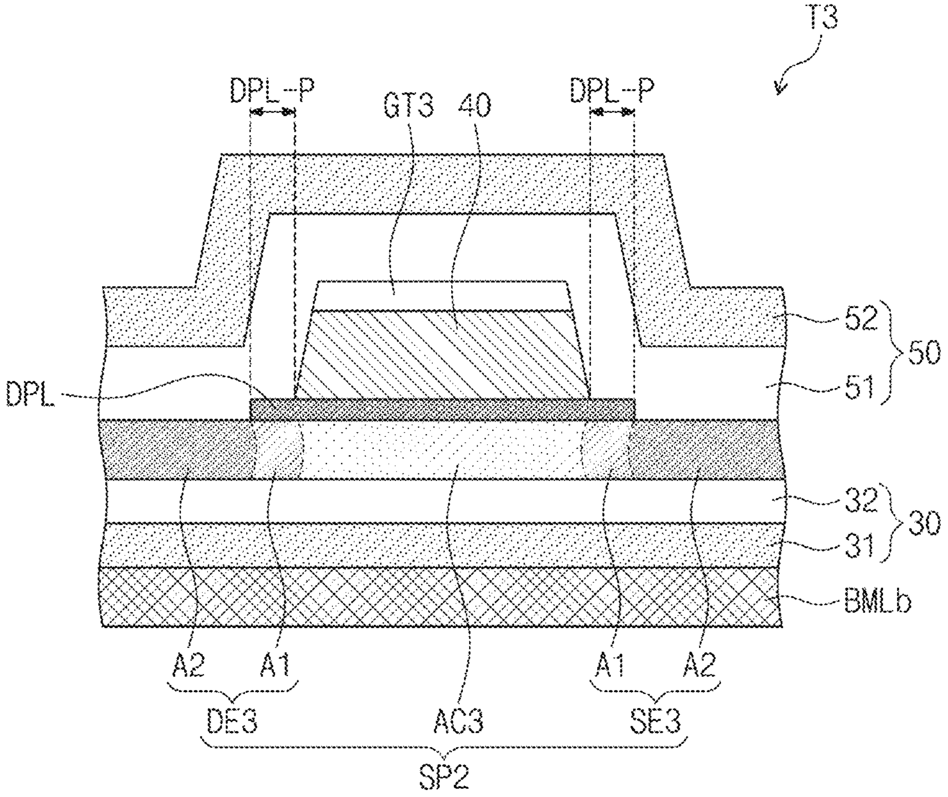
FIG. 5C is an enlarged cross-sectional view of an oxide transistor in FIG. 5B.

FIG. 4A is an enlarged plan view of a silicon transistor according to an embodiment. FIG. 4B is a cross-sectional view taken along I-I' of FIG. 4A. FIG. 5A is an enlarged plan view of an oxide transistor according to an embodiment. FIG. 5B is a cross-sectional view taken along II-II' of FIG. 5A. FIG. 5C is an enlarged cross-sectional view of an oxide transistor in FIG. 5B.

FIG. 4A illustrates a second transistor T2 in FIG. 3B as an example of a silicon transistor, and FIG. 5A illustrates a third transistor T3 in FIG. 3B as an example of an oxide transistor. FIGS. 4A to 5B are enlarged views of a part of a pixel PXij in FIG. 3B.

Referring to FIGS. 4A and 4B, a barrier layer **10*br* may be disposed on a base layer 110. The barrier layer 10*br* may prevent infiltration of foreign matters from the outside. The barrier layer 10*br* may include at least one inorganic layer. For example, the barrier layer 10*br*** may include a silicon oxide layer and/or a silicon nitride layer. The silicon oxide layer and the silicon nitride layer may be each provided in plurality, and silicon oxide layers and silicon nitride layers may be alternately stacked.

A first shield electrode BMLa may be disposed on the barrier layer **10*br***. The first shield electrode BMLa may include metal. The first shield electrode BMLa may include molybdenum (Mo), molybdenum-containing alloy, titanium (Ti), or titanium-containing alloy which have good heat resistance. The first shield electrode BMLa may receive a bias voltage. The first shield electrode BMLa may receive a first power supply voltage ELVDD (see FIG. 3B). The first shield electrode BMLa may block an electric potential caused by polarization from affecting the second transistor T2. The first shield electrode BMLa may block external light from reaching the second transistor T2. The first shield electrode BMLa may be a floating electrode having a shape isolated from other electrodes or lines.

A buffer layer 10*bf* covering the first shield electrode BMLa may be disposed on the barrier layer 10*br*. The buffer layer 10*bf* may prevent metal atoms or impurities from diffusing from the base layer 110 to a first semiconductor pattern SP1 disposed thereabove. The buffer layer 10*bf* may include at least one inorganic layer. The buffer layer 10*bf* may include a silicon oxide layer and/or a silicon nitride layer.

The first semiconductor pattern SP1 may be disposed on the buffer layer 10*bf*. The first semiconductor pattern SP1 may include a silicon semiconductor. For example, the silicon semiconductor may include amorphous silicon, polycrystalline silicon, or the like. The first semiconductor pattern SP1 may include low-temperature polysilicon.

The first semiconductor pattern SP1 may have different electrical properties according to whether it is doped or not. The first semiconductor pattern SP1 may include a first region having a high conductivity, and a second region having a low conductivity. The first region may be a region doped with an N-type dopant, or a P-type dopant. A P-type first region may be doped with a P-type dopant, and an N-type first region may be doped with a N-type dopant. The second region may be an undoped region, or a region doped with a lower concentration than the first region.

Since the first region may have a higher conductivity than the second region, the first region may substantially serve as an electrode or a signal line. The second region may substantially correspond to a channel region (or active region) of a transistor. A source region SE2, a channel region AC2 (or active region), and a drain region DE2 of the second transistor T2 may be formed from the first semiconductor pattern SP1. The source region SE2 and the drain region DE2 may extend from the channel region AC2 in directions opposite to each other.

A first insulating layer 10 covering the first semiconductor pattern SP1 may be disposed on the buffer layer 10*bf*. The first insulating layer 10 may be an inorganic layer. The first insulating layer 10 may include at least one of silicon oxide, silicon nitride, or silicon oxynitride. The first insulating layer 10 and second to fifth insulating layers 20, 30, 40, and 50 to be described later may each have a single- or multi-layered structure, and may include at least one of the aforementioned materials, but an embodiment of the present invention is not limited thereto.

A gate GT2 of the second transistor T2 may be disposed on the first insulating layer 10. As illustrated in FIG. 4A, a part of an i-th scanning line SLi in the first group (that is, a part overlapping the first semiconductor pattern SP1) may be the gate GT2 of the second transistor T2. The gate GT2 may overlap the channel region AC2 in the plan view.

In the process of doping the first semiconductor pattern SP1, the gate GT2 may serve as a mask that covers the channel region AC2. The gate GT2 may include molybdenum (Mo), molybdenum-containing alloy, titanium (Ti), titanium-containing alloy, or the like which have good heat resistance, but an embodiment of the present invention is not limited thereto. A second insulating layer 20 may be disposed on the first insulating layer 10, and the second insulating layer 20 may cover the gate GT2.

Referring to FIGS. 5A and 5B, a second shield electrode BMLb may be disposed on the second insulating layer 20. The second shield electrode BMLb may be a conductive pattern. The second shield electrode BMLb may be a part of an i-th scanning line GLi in the second group illustrated in FIG. 5A. The second shield electrode BMLb may include molybdenum (Mo), molybdenum-containing alloy, titanium (Ti), or titanium-containing alloy which have good heat resistance.

The second shield electrode BMLb may be disposed under a third transistor T3. In an embodiment, the second shield electrode BMLb may be omitted. A conductive pattern disposed on the layer same as a layer on which the first shield electrode BMLa (see FIG. 4B) is disposed may replace the second shield electrode BMLb.

A third insulating layer 30 may be disposed on the second insulating layer 20. A second semiconductor pattern SP2 may be disposed on the third insulating layer 30. The second semiconductor pattern SP2 may include an oxide semiconductor. The second semiconductor pattern SP2 may include a transparent conductive oxide ("TCO") such as indium tin oxide ("ITO"), indium zinc oxide ("IZO"), indium gallium zinc oxide ("IGZO"), zinc oxide (ZnOx), indium oxide ($In_2O_3$). Zinc oxide (ZnOx) may be zinc oxide (ZnO) and/or zinc peroxide ($ZnO_2$).

The oxide semiconductor (e.g., T3, T4) may include a plurality of regions divided according to whether the transparent conductive oxide is reduced or not. A region in which the transparent conductive oxide is reduced (hereinafter, reduced region) has a greater conductivity than a region in which the transparent conductive oxide is not reduced (hereinafter, non-reduced region). The reduced region has a higher hydrogen concentration than the non-reduced region, and substantially serve as a source/drain of a transistor, or a signal line. The non-reduced region substantially corresponds to a channel region AC3 (in other words, active region) of the third transistor T3. That is, a partial region of the second semiconductor pattern SP2 may be the channel region AC3 of the third transistor T3, and another partial region of the second semiconductor pattern SP2 may be a source region SE3 and a drain region DE3 of the third transistor T3. In FIG. 5A, a region disposed outside the source region SE3 and the drain region DE3 in the second semiconductor pattern SP2 is also a reduced region having a great conductivity, and therefore may substantially have the same properties as the source region SE3 and the drain region DE3.

A fourth insulating pattern 40 may be disposed on the third insulating layer 30. The fourth insulating pattern 40 may overlap the channel region AC3 of the third transistor T3 in the plan view. A gate GT3 of the third transistor T3 is disposed on the fourth insulating pattern 40.

A hydrogen diffusion barrier pattern DPL may be disposed between the third insulating layer 30 and the fourth insulating pattern 40. The hydrogen diffusion barrier pattern DPL may relatively have a great film density, and the hydrogen diffusion barrier pattern DPL may include an inorganic material having a low hydrogen concentration. Detailed description thereof will be made later. A fifth insulating layer 50, covering the fourth insulating pattern 40 and the gate GT3, may be disposed on the third insulating layer 30.

In the present embodiment, the third transistor T3 may include two gates. The two gates may be the second shield electrode BMLb, and the gate GT3 disposed on the fourth insulating pattern 40. The second shield electrode BMLb and the gate GT3 may be electrically connected through a connection electrode CNE. Although not illustrated in FIG. 5B, the connection electrode CNE may be disposed on the fifth insulating layer 50. A first contact hole CH1 in FIG. 5A may penetrate (i.e., be defined in) the third insulating layer 30 and the fifth insulating layer 50, and a second contact hole CH2 may penetrate (i.e., be defined in) the fifth insulating layer 50. The connection electrode CNE may connect the second shield electrode BMLb and the gate GT3 through the first contact hole CH1 and the second contact hole CH2.

Referring to FIG. 5B, a first organic insulating layer 60 may be disposed on the fifth insulating layer 50, and a second organic insulating layer 70 may be disposed on the first organic insulating layer 60. In an embodiment, the second organic insulating layer 70 may be omitted. The first organic insulating layer 60 may remove a stepped portion of the fifth insulating layer 50 disposed thereunder, and form a flat upper surface. The first organic insulating layer 60 and the second organic insulating layer 70 may each include a general-purpose polymer such as benzocyclobutene ("BCB"), polyimide, hexamethyldisiloxane ("HMDSO"), polymethylmethacrylate ("PMMA"), or polystyrene ("PS"), a polymer derivative having a phenolic group, an acrylic polymer, an imide-based polymer, an arylether-based polymer, an amide-based polymer, a fluorine-based polymer, a p-xylene-based polymer, a vinylalcohol-based polymer, a blend thereof, etc.

A light-emitting element LD1 illustrated in FIGS. 4B and 5B may include an anode AE1, a light-emitting layer EML1, and a cathode CE. The anode AE1 may be disposed on the second organic insulating layer 70. The anode AE1 may be a transparent electrode, a translucent electrode, and a reflective electrode. The anode AE1 may include a reflective layer formed of Ag, Mg, Al, Pt, Pd, Au, Ni, Nd, Ir, Cr, a compound thereof, or the like, and a transparent or translucent electrode layer formed on the reflective layer. The transparent or translucent electrode layer may include at least one selected from the group consisting of indium tin oxide (ITO), indium zinc oxide (IZO), indium gallium zinc oxide (IGZO), zinc oxide (ZnOx), indium oxide ($In_2O_3$), and aluminum-doped zinc oxide ("AZO"). For example, the anode AE1 may include a three-layered structure of ITO/Ag/ITO, but an embodiment of the present invention is not limited thereto.

The pixel-defining film PDL may be disposed on the second organic insulating layer 70. The pixel-defining film PDL may have a transparent property, or a light-absorbing property. For example, the pixel-defining film PDL that absorbs light may include a black coloring agent. The black coloring agent may include a black dye, or a black pigment. The black coloring agent may include carbon black, metal such as chromium, or an oxide thereof. The pixel-defining film PDL may correspond to a shielding pattern having light-blocking characteristics.

The pixel-defining film PDL may partially cover the anode AE1. For example, an opening PDL-OP partially exposing the anode AE1 may be defined in the pixel-defining film PDL. The pixel-defining film PDL may increase a distance between an edge of the anode AE1 and a cathode CE. Accordingly, the pixel-defining film PDL may play a role in preventing an arc from occurring at the edge of the anode AE1.

Although not illustrated, a hole transport layer may be disposed between the anode AE1 and the light-emitting layer EML1. In addition, a hole injection layer may be disposed between the anode AE1 and the hole transport layer. An electron transport layer may be disposed between the light-emitting layer EML1 and the cathode CE. An electron injection layer may be disposed between the electron transport layer and the cathode CE.

An encapsulation layer 140 may be disposed on the light-emitting element layer 130. The encapsulation layer 140 may include an inorganic encapsulation layer 141, an organic encapsulation layer 142, and an inorganic encapsulation layer 143 which are sequentially stacked, but layers constituting the encapsulation layer 140 are not limited thereto.

The inorganic encapsulation layers 141 and 143 may protect the light-emitting element layer 130 from moisture and oxygen, and the organic encapsulation layer 142 may protect the light-emitting element layer 130 from foreign matters such as dust particles. The inorganic encapsulation layers 141 and 143 may include a silicon nitride layer, a silicon oxynitride layer, a silicon oxide layer, a titanium oxide layer, an aluminum oxide layer, or the like. The organic encapsulation layer 142 may include an acrylic organic layer, but an embodiment of the present invention is not limited thereto.

Referring to FIGS. 5A and 5C, the third transistor T3 will be described in more detail. As illustrated in FIG. 5C, the third insulating layer 30 disposed on the second shield electrode BMLb may include a silicon nitride layer 31 and a silicon oxide layer 32. The fourth insulating pattern 40 may include silicon oxide, silicon nitride, or silicon oxynitride.

The fifth insulating layer 50 disposed on the gate GT3 may include a silicon oxide layer 51 and a silicon nitride layer 52. The silicon nitride layers 31 and 52 have a higher hydrogen concentration than the silicon oxide layers 32 and 51. Each of the silicon nitride layers 31 and 52 may have a hydrogen concentration of about $3\times10^{22}$ atoms per cubic centimeters (at/$cm^3$) or less. The silicon oxide layers 32 and 51 each may have a hydrogen concentration of about $2\times10^{19}$ at/$cm^3$. In an embodiment, the positions of the silicon nitride layers 31 and 52 and the silicon oxide layers 32 and 51 may be changed.

Referring to FIGS. 5A and 5C, the hydrogen diffusion barrier pattern DPL may include an inorganic material having a relatively low hydrogen concentration. The hydrogen diffusion barrier pattern DPL may include silicon oxide having a lower hydrogen concentration than a hydrogen concentration of each of the fourth insulating pattern 40 and the silicon oxide layer 51 adjacent thereto. The hydrogen diffusion barrier pattern DPL including silicon oxide may have a hydrogen concentration of about 1/10 or less of the hydrogen concentration of the fourth insulating pattern 40 of silicon oxide or the silicon oxide layers 32 and 51. The hydrogen diffusion barrier pattern DPL formed of silicon oxide may have a hydrogen concentration of about $2\times10^{18}$ at/$cm^3$ or less. In addition to that, the hydrogen diffusion barrier pattern DPL may include aluminum oxide or chromium oxide having a low hydrogen concentration.

The hydrogen diffusion barrier pattern DPL is another insulating pattern separated from the fourth insulating pattern 40. When one of the hydrogen diffusion barrier pattern DPL and the fourth insulating pattern 40 is defined as a first insulating pattern, the other one may be defined as a second insulating pattern.

The hydrogen diffusion barrier pattern DPL prevents hydrogen diffusion towards the channel region AC3 during the process of forming the fourth insulating pattern 40 and the fifth insulating layer 50. In particular, the hydrogen diffusion barrier pattern DPL blocks a large amount of hydrogen from diffusing to the channel region AC3 during the process of forming the silicon nitride layer 52 of the fifth insulating layer 50. Hydrogen corresponds to a dopant for an N-type oxide transistor. The source region SE3 and the drain region DE3 in which hydrogen is diffused (or doped) have an improved conductivity.

A part DPL-P (hereinafter, protrusion portion) of the hydrogen diffusion barrier pattern DPL is disposed outside the fourth insulating pattern 40 in a plan view. A first region A1 and a second region A2 may be defined, by the protrusion portion DPL-P, in the source region SE3 and the drain region DE3, respectively. The first region A1 overlaps the protrusion portion DPL-P, and the second region A2 is disposed outside the hydrogen diffusion barrier pattern DPL in a plan view. Each of the source region SE3 and the drain region DE3 may include the first region A1 and at least a part of the second region A2.

Referring to FIG. 5A, the protrusion portion DPL-P surrounds, in a plan view, a conductive pattern which defines the gate GT3. The shape of the protrusion portion DPL-P is determined by a manufacturing process for the hydrogen diffusion barrier pattern DPL and the fourth insulating pattern 40. Detailed description thereof is omitted herein.

When the channel region AC3 has a first hydrogen concentration, the first region A1 has a second hydrogen concentration higher than the first hydrogen concentration, and the second region A2 has a third hydrogen concentration higher than the second hydrogen concentration. Since hydrogen diffusing to the first region A1 is partially blocked by the protrusion portion DPL-P, the first region A1 has a lower hydrogen concentration than the second region A2.

The first region A1 may prevent a sharp increase in electric field between the channel region AC3 and the drain region DE3 (specifically, the second region A2 of the drain region), or between the channel region AC3 and the source region SE3 (specifically, the second region A2 of the source region) (hereinafter, drain/source field decrease effect). Accordingly, off-current (or leakage current) of the third transistor T3 may be effectively reduced, and hot carrier effect ("HCE") due to reduction of the length of the channel region AC3 may be suppressed as well.

The first region A1 may prevent a certain defect. The certain detect is that hydrogen excessively diffuses to a region overlapping the gate GT3 of the second semiconductor pattern SP2, thereby shortening the length of the channel region AC3. In other words, although a transistor having a short channel length is designed, a defect in which an actual length of the channel region is shortened more than the designed length due to a process may be prevented. For example, when the channel region AC3 of the third transistor T3 is designed to have a predetermined length in a range of about 3 micrometers (μm) or less, the first region A1 may prevent the length of the channel region AC3 from being shortened more than the designed length. As a result, the first region A1 may prevent the threshold voltage of a transistor from decreasing.

In the present embodiment, although an oxide transistor is described as an example, the hydrogen diffusion barrier pattern DPL may be applied to a silicon transistor illustrated in FIGS. 4A and 4B. The hydrogen diffusion barrier pattern DPL may be disposed, as a doping prevention pattern, on the channel region AC2 illustrated in FIG. 4B. The first insulating layer 10 may be deformed to a pattern like the fourth insulating pattern 40. In a doping process of using the gate GT2 as a mask, the doping prevention pattern protruding from the gate GT2 to the outside in a plan view may form a low concentration doping region (hereinafter, the first region A1) and a high concentration doping region (hereinafter, the second region A2) in the drain region DE2 (see FIG. 5B) and/or the source region SE2 (see FIG. 5B).

FIGS. 6A to 6E are cross-sectional views illustrating a manufacturing process for a display panel DP. FIGS. 6A to 6E illustrate views with reference to the cross-section in FIG. 5C.

Figure 6A:
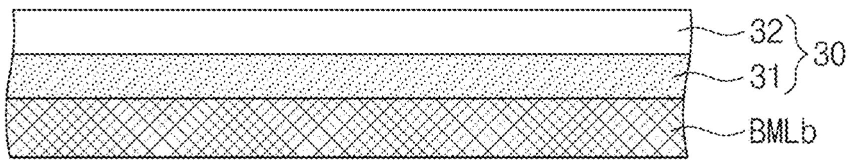
FIGS. 6A to 6E are cross-sectional views illustrating processes for manufacturing a display panel.

As illustrated in FIG. 6A, at least one third insulating layer 30 covering a second shield electrode BMLb is formed. The third insulating layer 30 may include an inorganic layer. A silicon nitride layer 31 and a silicon oxide layer 32 may be sequentially formed. The silicon nitride layer 31 and the silicon oxide layer 32 may be sequentially formed through a Plasma Enhanced Chemical Vapor Deposition ("PECVD") process. In the PECVD process, $SiH_4$ is used as a Si precursor. The silicon nitride layer 31 uses $NH_3/N_2$ as reaction gases, and the silicon oxide layer 32 uses $N_2O$ as a reaction gas. Accordingly, more hydrogen may occur in the process of forming the silicon nitride layer 31.

In another embodiment of the present invention, the third insulating layer 30 may further include a silicon oxynitride layer, or either of the silicon nitride layer 31 or the silicon oxide layer 32 may be replaced with a silicon oxynitride layer. In still another embodiment, only one of the silicon nitride layer 31 and the silicon oxide layer 32 may be formed.

Figure 6B:
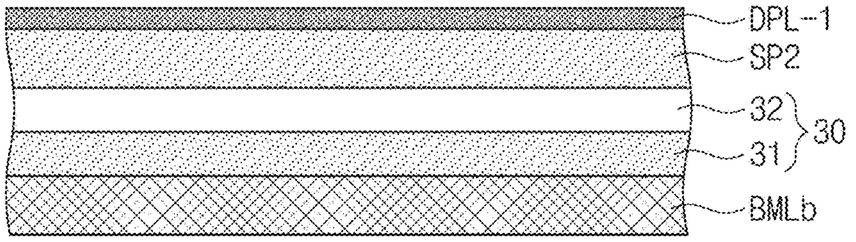

As illustrated in FIG. 6B, a second semiconductor pattern SP2 is formed. After forming a semiconductor layer, the semiconductor layer is patterned through a photolithography process and an etching process. A hydrogen diffusion barrier layer DPL-1 is formed on the second semiconductor pattern SP2.

A silicon oxide layer having a low hydrogen content may be formed as the hydrogen diffusion barrier layer DPL-1 through atomic layer deposition ("ALD"). The silicon oxide layer has a low permeation reduction factor ("PRF"), but may increase a hydrogen-blocking rate by lowering a hydrogen content in the silicon oxide layer and removing pin holes through atomic layer deposition. The silicon oxide layer formed through atomic layer deposition may have a hydrogen content of about 1/10 or less of that of the silicon oxide formed by a PECVD process.

An aluminum oxide layer or a chromium oxide layer having a high permeation reduction factor (PRF) may be formed. A manufacturing method of the aluminum oxide layer or the chromium oxide layer is not specially limited.

Figure 6C:
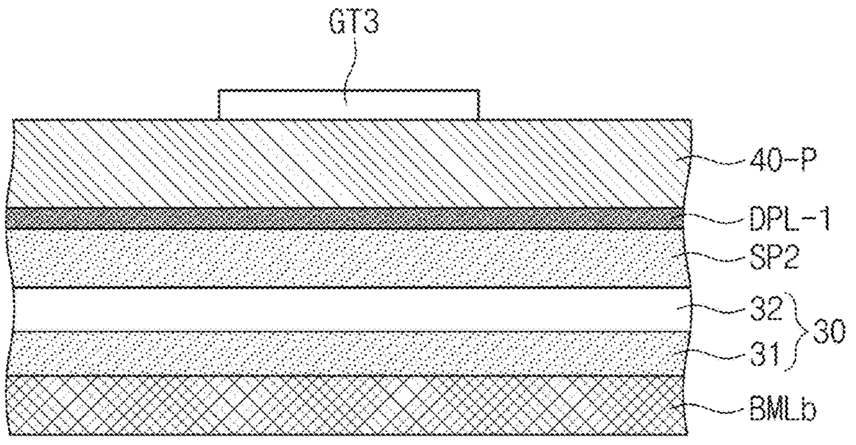

As illustrated in FIG. 6C, at least one fourth inorganic layer 40-P covering the hydrogen diffusion barrier layer DPL-1 is formed. A silicon oxide layer having a relatively lower hydrogen concentration than a silicon nitride layer may be formed as the fourth inorganic layer 40-P. The silicon oxide layer may be formed through a PECVD process.

Then, a gate GT3 overlapping the second semiconductor pattern SP2 in the plan view is formed on the fourth inorganic layer 40-P. After forming a metal layer, the metal layer may be patterned through a photolithography process and an etching process.

Figure 6D:
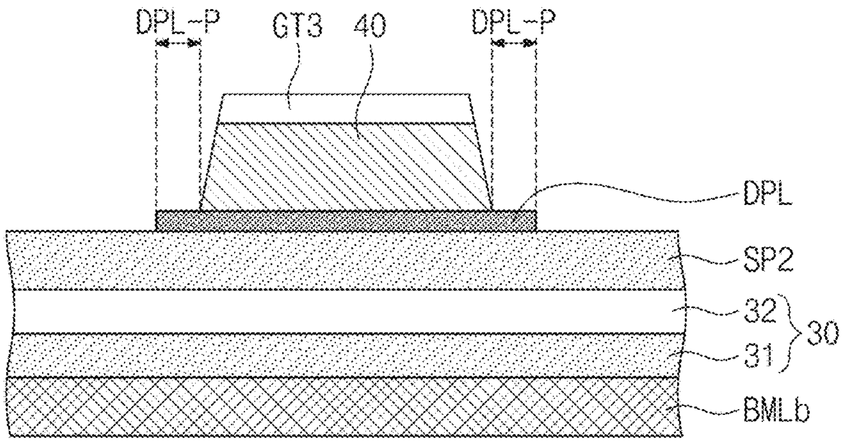

As illustrated in FIG. 6D, the fourth inorganic layer 40-P and the hydrogen diffusion barrier layer DPL-1 are patterned using the gate GT3 as a mask. The fourth inorganic layer 40-P and the hydrogen diffusion barrier layer DPL-1 may be patterned through a single etching process. The hydrogen diffusion barrier pattern DPL and the fourth insulating pattern 40 (or gate insulating pattern) are formed from the hydrogen diffusion barrier layer DPL-1 and the fourth inorganic layer 40-P, respectively.

The fourth inorganic layer 40-P and the hydrogen diffusion barrier layer DPL-1 which are formed of different materials may have different etching rates. The hydrogen diffusion barrier layer DPL-1 having a lower hydrogen concentration and a higher density than the fourth inorganic layer 40-P may have a relatively small etching rate. For this reason, a protrusion portion DPL-P may be defined as illustrated in FIG. 6D, and the protrusion portion DPL-P may surround a conductive pattern defining the gate GT3 and the fourth insulating pattern 40 disposed under the conductive pattern in a plan view, as illustrated in FIG. 5A.

According to an embodiment of the present invention, the fourth inorganic layer 40-P and the hydrogen diffusion barrier layer DPL-1 may be patterned in different operations. It is also possible that the hydrogen diffusion barrier pattern DPL is formed earlier than the fourth inorganic layer 40-P by forming the hydrogen diffusion barrier layer DPL-1 in an operation illustrated in FIG. 6B and then patterning the hydrogen diffusion barrier layer DPL-1 immediately.

Figure 6E:
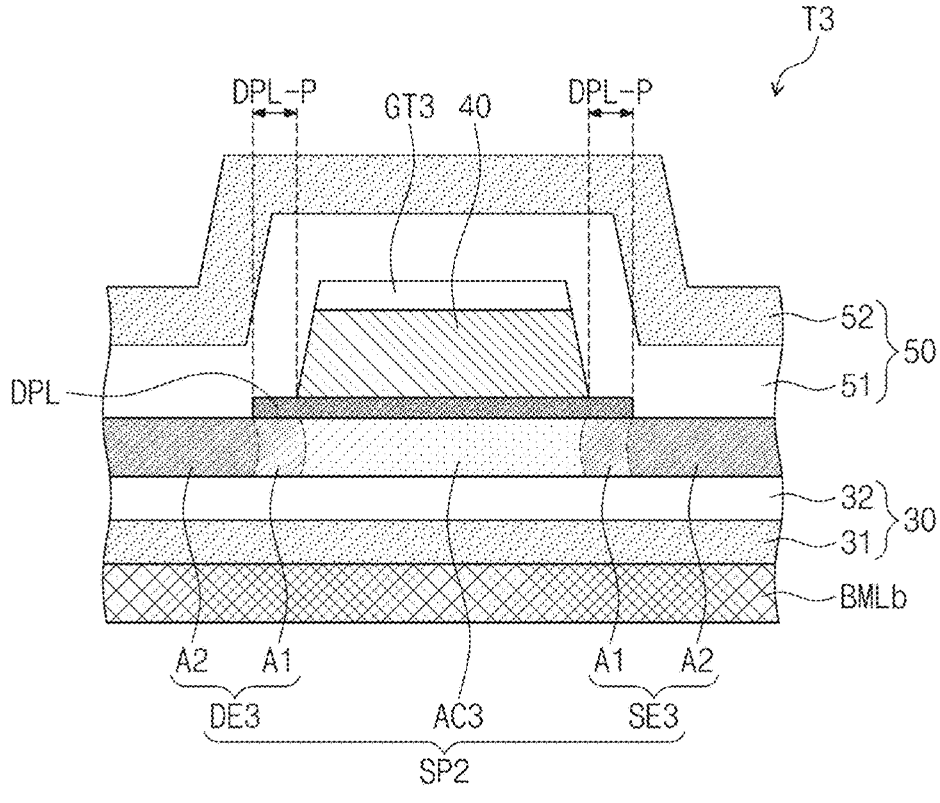

As illustrated in FIG. 6E, at least one fifth insulating layer 50 covering the gate GT3 is formed. The fifth insulating layer 50 may include an inorganic layer. The silicon oxide layer 51 and the silicon nitride layer 52 may be sequentially formed. The silicon oxide layer 51 and the silicon nitride layer 52 may be formed through a PECVD process.

In the process of forming the fifth insulating layer 50, hydrogen diffuses to the second semiconductor pattern SP2. The second semiconductor pattern SP2 is divided into a plurality of regions having different hydrogen concentrations due to the effect of masking the gate GT3 and the protrusion portion DPL-P.

In an embodiment of the present invention, the fifth insulating layer 50 may further include a silicon oxynitride layer, or either of the silicon oxide layer 51 or the silicon nitride layer 52 may be replaced with a silicon oxynitride layer. Only one of the silicon oxide layer 51 and the silicon nitride layer 52 may be formed. Then, the process of forming organic layers 60 and 70, a light-emitting element layer 130, and an encapsulation layer 140 may be additionally processed.

Figure 7A:
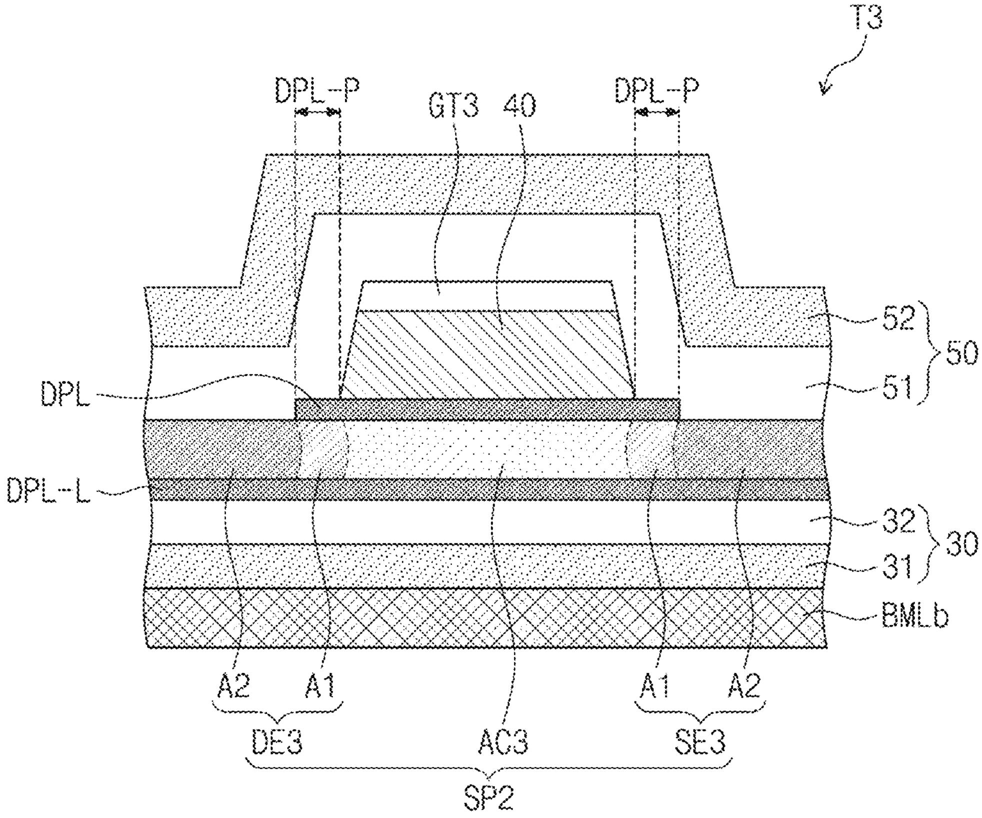
FIG. 7A is an enlarged cross-sectional view of an oxide transistor according to another embodiment.
Figure 7B:
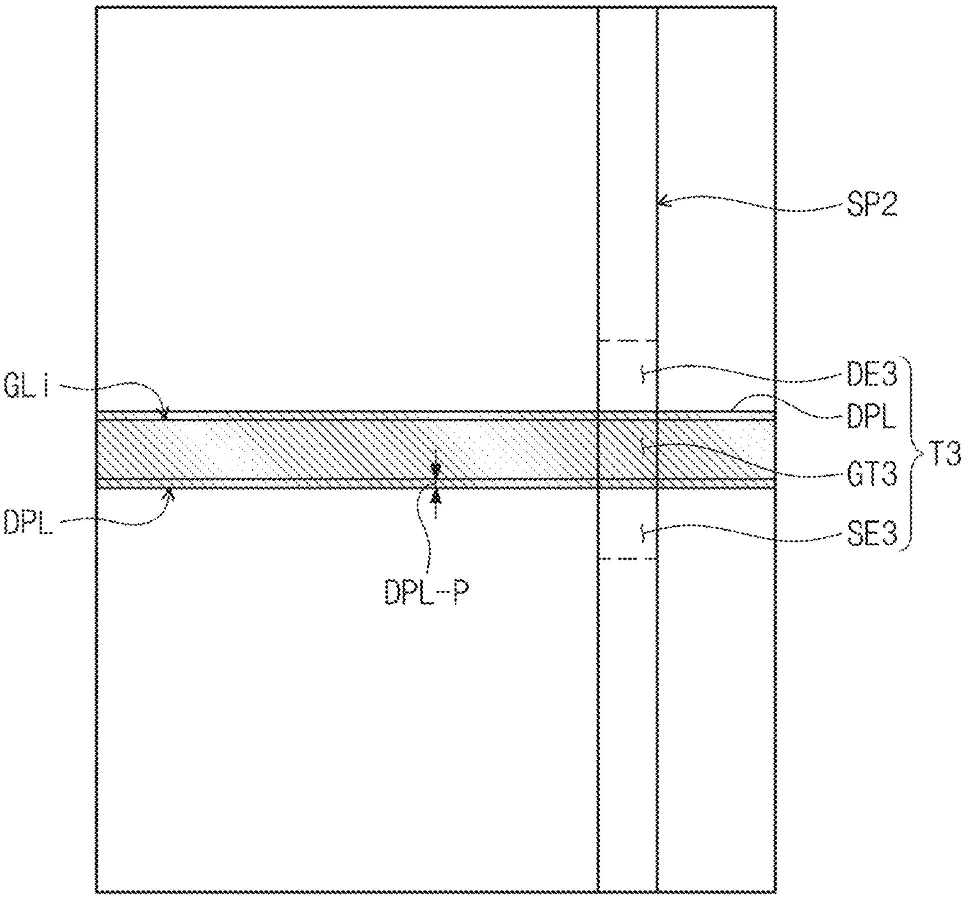
FIG. 7B is an enlarged plan view of an oxide transistor according to an embodiment.

FIG. 7A is an enlarged cross-sectional view of an oxide transistor according to another embodiment. FIG. 7B is an enlarged plan view of an oxide transistor according to an embodiment.

Referring to FIG. 7A, a display panel DP may further include a lower hydrogen diffusion barrier layer DPL-L disposed between a third insulating layer 30 and a second semiconductor pattern SP2. The lower hydrogen diffusion barrier layer DPL-L may prevent hydrogen from diffusing from the third insulating layer 30 toward the second semiconductor pattern SP2.

The lower hydrogen diffusion barrier layer DPL-L may include one of the aforementioned materials constituting a hydrogen diffusion barrier pattern DPL, and may be formed using one of methods of forming the hydrogen diffusion barrier pattern DPL. The lower hydrogen diffusion barrier layer DPL-L is not patterned unlike the hydrogen diffusion barrier pattern DPL. The lower hydrogen diffusion barrier layer DPL-L may entirely overlap a display region 100-A illustrated in FIG. 1. Here, the wording, "entirely overlap" excludes a case of being partially removed by a contact hole.

In the present embodiment, the hydrogen diffusion barrier layer DPL-1 may correspond to an uppermost inorganic layer among a plurality of inorganic layers disposed between a second shield electrode BMLb and the second semiconductor pattern SP2. In other words, the hydrogen diffusion barrier layer DPL-1 may be a part of the third insulating layer 30.

The hydrogen diffusion barrier layer DPL-1 may be formed after forming a silicon oxide layer 32 illustrated in FIG. 6A. The hydrogen diffusion barrier layer DPL-1 may be an inorganic layer formed under a process condition different from the condition under which the silicon oxide layer 32 is formed. The hydrogen diffusion barrier layer DPL-1 may be in contact with the second semiconductor pattern SP2, and may be a silicon oxide layer having a hydrogen concentration of about $1/10$ or less of that of the silicon oxide layer 32. The hydrogen diffusion barrier layer DPL-1 may be an aluminum oxide layer or a chromium oxide layer in contact with the second semiconductor pattern SP2.

Referring to FIG. 7B, a third transistor T3 may include one gate GT3. The gate GT3 may correspond to a partial region of an i-th scanning line GLi in a second group. The hydrogen diffusion barrier pattern DPL may extend along the i-th scanning line GLi in the second group.

Figure 8A:
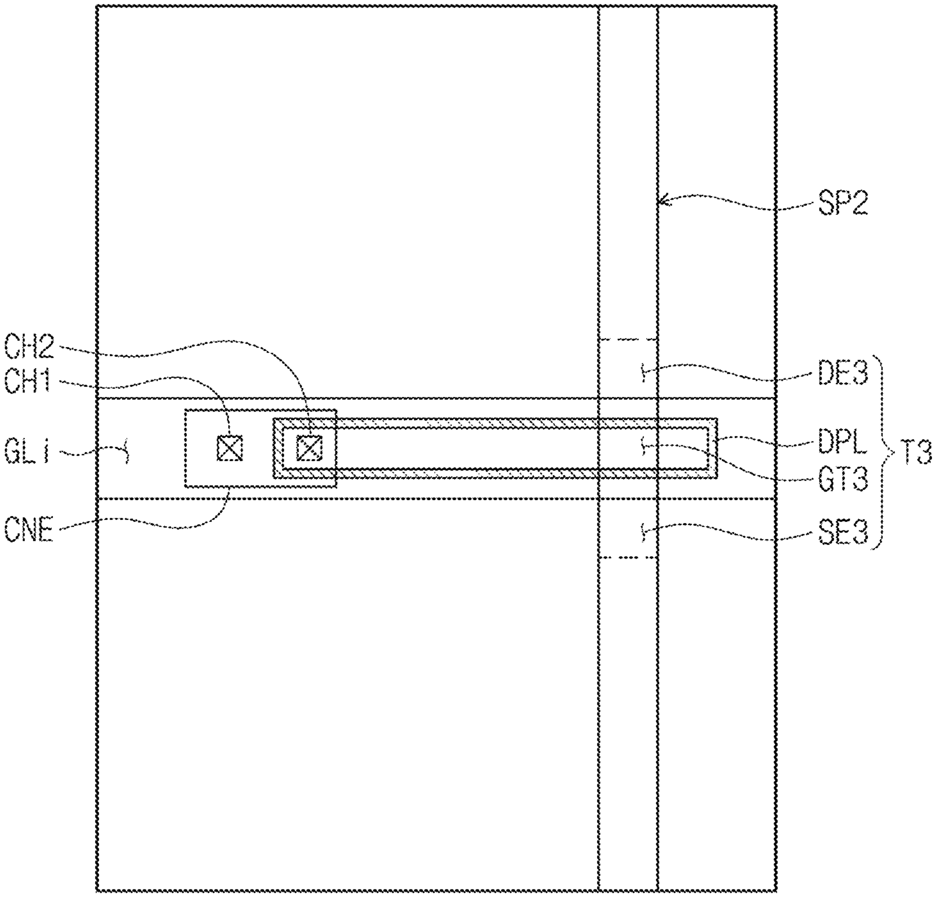
FIG. 8A is an enlarged plan view of an oxide transistor according to another embodiment.
Figure 8B:
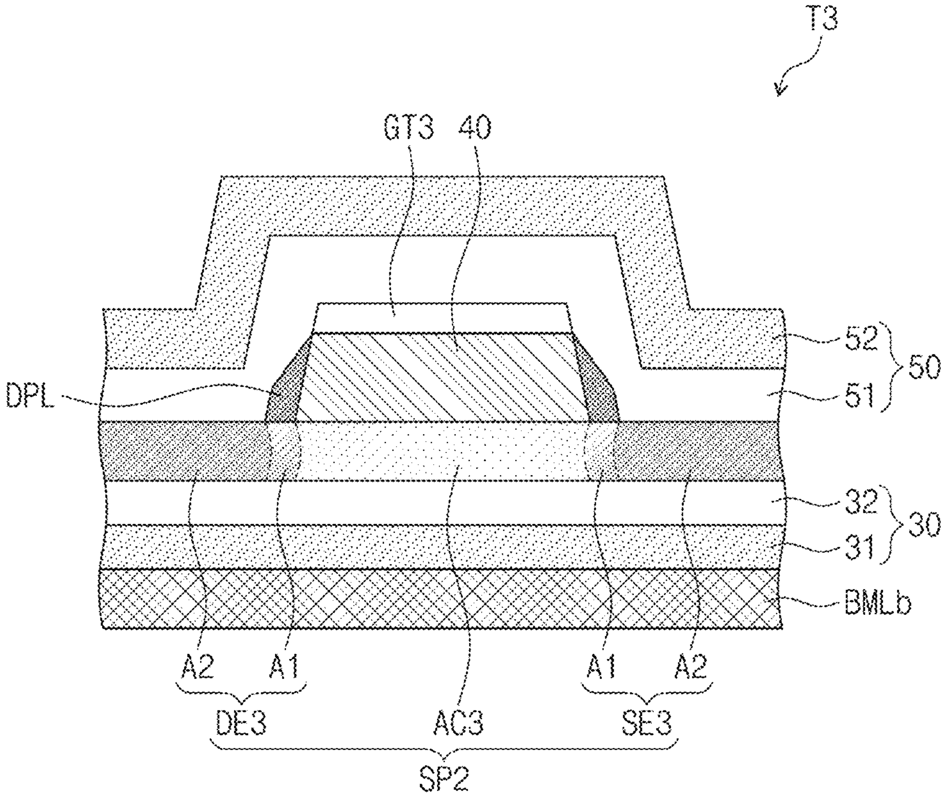
FIG. 8B is an enlarged cross-sectional view of an oxide transistor in FIG. 8A.

FIG. 8A is an enlarged plan view of an oxide transistor according to another embodiment. FIG. 8B is an enlarged cross-sectional view of an oxide transistor in FIG. 8A. FIGS. 9A to 9G are cross-sectional views illustrating a manufacturing process of a display panel. Hereinafter, detailed description of the same configuration as that described with reference to FIGS. 1 to 7B will be omitted.

Referring to FIGS. 8A to 8B, a hydrogen diffusion barrier pattern DPL is disposed outside a fourth insulating pattern 40 in a plan view. The hydrogen diffusion barrier pattern DPL according to the present embodiment is disposed in a region corresponding to the protrusion portion DPL-P illustrated in FIGS. 5A to 5C.

The hydrogen diffusion barrier pattern DPL does not overlap the upper surface of the fourth insulating pattern 40 in the plan view, and is in contact with the side surface of the fourth insulating pattern 40. The hydrogen diffusion barrier pattern DPL may be an extension of the fourth insulating pattern 40 so as not to overlap a gate GT3 in the plan view.

A region in which the hydrogen diffusion barrier pattern DPL is disposed has a lower hydrogen-blocking rate than a region overlapping the gate GT3, but has a higher hydrogen-blocking rate than a region exposed from the hydrogen diffusion barrier pattern DPL. Accordingly, a plurality of region having different hydrogen concentrations are formed in a second semiconductor pattern SP2.

Figure 9A:
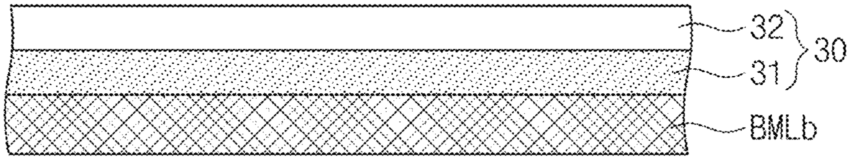
FIGS. 9A to 9G are cross-sectional views illustrating processes for manufacturing a display panel.
Figure 9B:
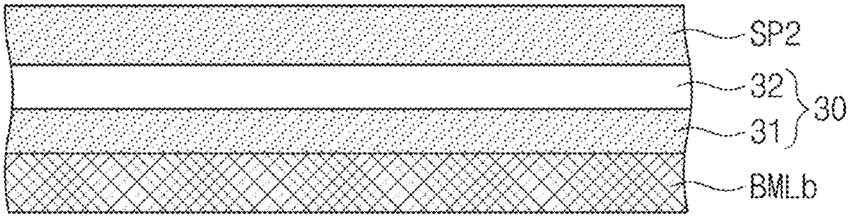
Figure 9C:
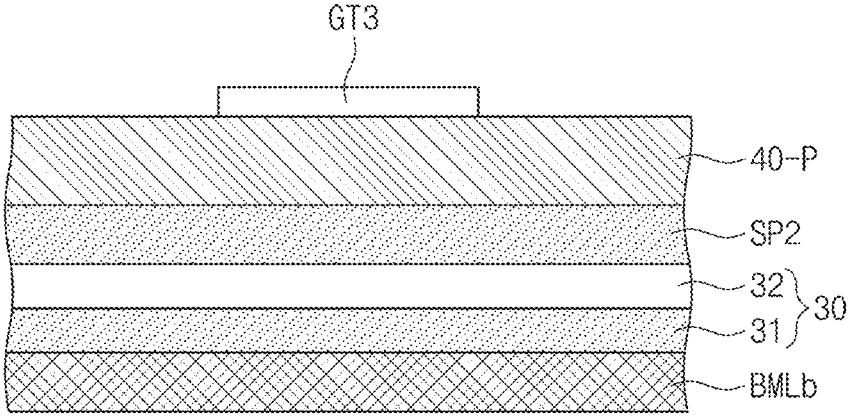

As illustrated in FIGS. 9A to 9C, a third insulating layer 30, the second semiconductor pattern SP2, a fourth inorganic layer 40-P, and the gate GT3 are sequentially formed. According to the present embodiment, unlike the manufacturing process illustrated in FIGS. 6A to 6C, the hydrogen diffusion barrier layer DPL-1 is not formed between forming of the second semiconductor pattern SP2 and forming of the fourth inorganic layer 40-P.

Figure 9D:
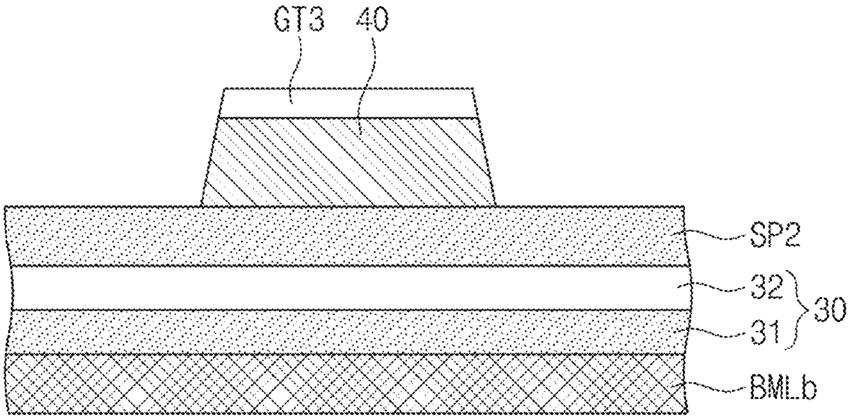

As illustrated in FIG. 9D, the fourth inorganic layer 40-P is patterned using the gate GT3 as a mask. The fourth insulating pattern 40 (or gate insulating pattern) is formed from the fourth inorganic layer 40-P.

Figure 9E:
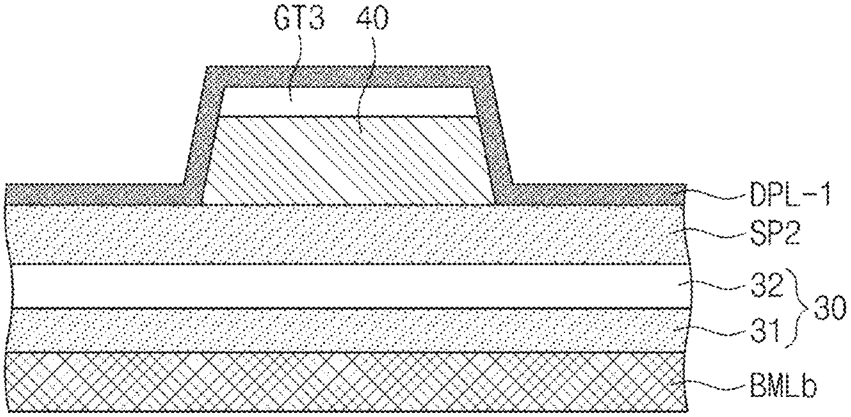

As illustrated in FIG. 9E, a hydrogen diffusion barrier layer DPL-1 covering the gate GT3 and the fourth insulating pattern 40 is formed. A forming method of the hydrogen diffusion barrier layer DPL-1 may be the same as one of the methods described with reference to FIG. 6B. The hydrogen diffusion barrier layer DPL-1 may be in contact with the side surfaces of the fourth insulating pattern 40.

Figure 9F:
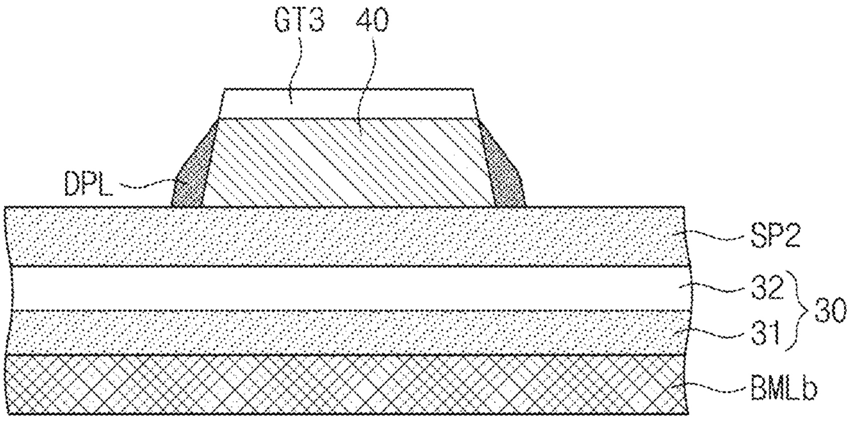

As illustrated in FIG. 9F, the hydrogen diffusion barrier layer DPL-1 is patterned. The hydrogen diffusion barrier layer DPL-1 may be patterned using an anisotropic dry etching process. A region, of the hydrogen diffusion barrier layer DPL-1, contacting the side surfaces of the fourth insulating pattern 40 is relatively little etched. Accordingly, the hydrogen diffusion barrier pattern DPL may be formed from the hydrogen diffusion barrier layer DPL-1.

Figure 9G:
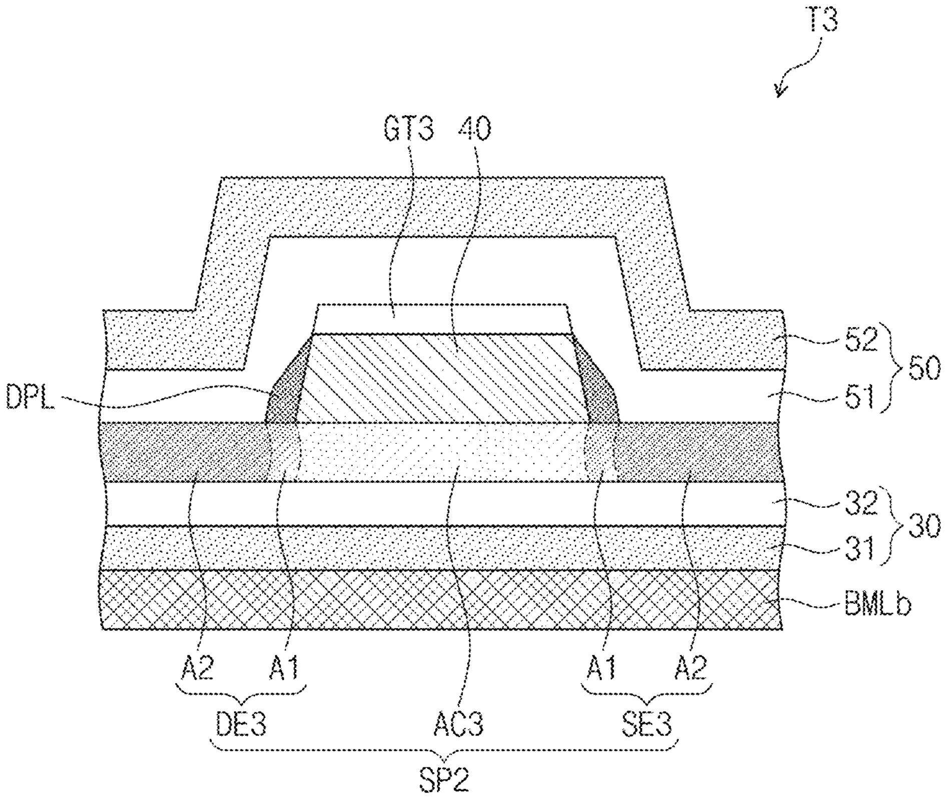

As illustrated in FIG. 9G, a fifth insulating layer 50 covering the hydrogen diffusion barrier pattern DPL is formed. Thereafter, a forming process of organic layers 60 and 70, a light-emitting element layer 130, and an encapsulation layer 140 illustrated in FIG. 5C may be further processed.

According to the above description, a drain region and a source region may include two regions which have different hydrogen concentrations and are formed by a second insulating pattern. Among the two regions, a region adjacent to a channel region may have a lower hydrogen concentration, thereby reducing leakage current of a transistor.

The region having a relatively low hydrogen concentration may suppress leakage current, and also suppress hot carrier effect (HCE). The region having a relatively low hydrogen concentration may prevent the length of the channel region of a transistor from becoming shorter than the target length. The transistor may be appropriate for a high-resolution display panel.

In the above, description has been made with reference to preferred embodiments of the present invention, but those skilled in the art or those of ordinary skill in the relevant technical field may understand that various modifications and changes may be made to the present invention within the scope not departing from the spirit and the technology scope of the present invention described in the claims to be described later.

Therefore, the technical scope of the present invention is not limited to the contents described in the detailed description of the specification, but should be determined by the claims.

What is claimed is:

1. A display panel comprising:
- a light-emitting element; and
- a pixel circuit electrically connected to the light-emitting element,
- wherein the pixel circuit comprises a first transistor,
  - the first transistor including
    - a gate,
    - a first insulating pattern overlapping the gate, and disposed under the gate,
    - a second insulating pattern disposed under the first insulating pattern and extending further than the first insulating pattern to include a certain part disposed outside the first insulating pattern in a plan view, and
    - a first semiconductor pattern comprising an oxide semiconductor, disposed under the first insulating pattern and the second insulating pattern, and overlapping the first insulating pattern and the second insulating pattern in the plan view,
- wherein each of the first insulating pattern and the second insulating pattern comprises an inorganic material, and the second insulating pattern has a lower hydrogen concentration than a hydrogen concentration of the first insulating pattern,
- wherein the first semiconductor pattern comprises a first region having a first doping concentration, a second region having a second doping concentration higher than the first doping concentration, and a third region having a third doping concentration higher than the second doping concentration, and
- the first region overlaps the first insulating pattern, the second region overlaps the certain part of the second insulating pattern and does not overlap the gate and the first insulating pattern, and the third region is disposed outside the second insulating pattern in the plan view.

2. The display panel of claim 1, wherein
- the first hydrogen concentration of the first region is lower than the second hydrogen concentration of the second region, and the second hydrogen concentration is lower than the third hydrogen concentration of the third region.

3. The display panel of claim 2, wherein the first region is defined as a channel region, and the channel region has a length of about 3 micrometers (μm) or less.

4. The display panel of claim 2, wherein a source region and a drain region which are disposed with the first region therebetween include the second region.

5. The display panel of claim 2, wherein the certain part of the second insulating pattern surrounds, in the plan view, a conductive pattern which defines the gate.

6. The display panel of claim 2, wherein the pixel circuit further comprises a second transistor,
- the second transistor comprises a second semiconductor pattern disposed on a different layer from the first semiconductor pattern, and
- the second semiconductor pattern comprises polysilicon.

7. The display panel of claim 1, wherein the second insulating pattern comprises silicon oxide, aluminum oxide, or chromium oxide.

8. The display panel of claim 1, wherein the first insulating pattern and the second insulating pattern comprises silicon oxide.

9. The display panel of claim 1, further comprising:
- a conductive pattern overlapping the first semiconductor pattern, and disposed on a lower side of the first semiconductor pattern; and
- a plurality of inorganic layers disposed between the conductive pattern and the first semiconductor pattern,
- wherein the plurality of inorganic layers comprises:
  - a first silicon oxide layer in contact with the first semiconductor pattern;
  - a second silicon oxide layer disposed under the first silicon oxide layer; and
  - a silicon nitride layer disposed under the first silicon oxide layer,
- wherein a hydrogen concentration of the first silicon oxide layer is equal to or less than about 1/10 of a hydrogen concentration of the second silicon oxide layer.

10. The display panel of claim 9, wherein the conductive pattern is electrically connected to the gate.

11. The display panel of claim 1, further comprising:
- a conductive pattern overlapping the first semiconductor pattern, and disposed under the first semiconductor pattern;
- a hydrogen diffusion barrier layer disposed between the conductive pattern and the first semiconductor pattern, and contacting the conductive pattern; and
- a silicon oxide layer, a silicon nitride layer, or a silicon oxynitride layer disposed between the conductive pattern and the hydrogen diffusion barrier layer,
- wherein the hydrogen diffusion barrier layer comprises an aluminum oxide layer, a chromium oxide layer, or a silicon oxide layer having a hydrogen concentration of about $2\times10^{18}$ atoms per cubic centimeters (at/$cm^3$) or less.

12. A display panel comprising:
- a light-emitting element; and
- a pixel circuit electrically connected to the light-emitting element,
- wherein the pixel circuit comprises a first transistor,
- the first transistor including
- a gate,
- a first insulating pattern overlapping the gate, and disposed under the gate, a second insulating pattern being contact with a side surface of the first insulating pattern, not being contact with the gate, and disposed outside the first insulating pattern in a plan view, and a first semiconductor pattern disposed under the first insulating pattern and the second insulating pattern, and overlapping the first insulating pattern and the second insulating pattern in the plan view, wherein each of the first insulating pattern and the second insulating pattern comprises an inorganic material, and the second insulating pattern has a lower hydrogen concentration than a hydrogen concentration of the first insulating pattern, wherein the first semiconductor pattern comprises a first region having a first doping concentration, a second region having a second doping concentration higher than the first doping concentration, and a third region having a third doping concentration higher than the second doping concentration, and the first region overlaps the first insulating pattern, the second region overlaps the second insulating pattern and does not overlap the gate and the first insulating pattern, and the third region is disposed outside the second insulating pattern in the plan view.

* * * * *